(12) United States Patent
Yamaguchi et al.

(10) Patent No.: US 8,958,207 B2
(45) Date of Patent: Feb. 17, 2015

(54) HEAT RADIATION MATERIAL, ELECTRONIC DEVICE AND METHOD OF MANUFACTURING ELECTRONIC DEVICE

(75) Inventors: Yoshitaka Yamaguchi, Kawasaki (JP); Taisuke Iwai, Kawasaki (JP); Shinichi Hirose, Kawasaki (JP); Daiyu Kondo, Kawasaki (JP); Ikuo Soga, Kawasaki (JP); Yohei Yagishita, Kawasaki (JP); Yukie Sakita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 260 days.

(21) Appl. No.: 13/465,393

(22) Filed: May 7, 2012

(65) Prior Publication Data

US 2012/0218713 A1 Aug. 30, 2012

Related U.S. Application Data

(62) Division of application No. 12/614,063, filed on Nov. 6, 2009, now Pat. No. 8,194,407.

(30) Foreign Application Priority Data

Nov. 14, 2008 (JP) ................................. 2008-292320

(51) Int. Cl.
*H05K 7/20* (2006.01)
*H01L 23/433* (2006.01)
(Continued)

(52) U.S. Cl.
CPC ............ *H01L 23/433* (2013.01); *H01L 23/373* (2013.01); *H01L 24/28* (2013.01);
(Continued)

(58) Field of Classification Search
USPC ........................ 361/679.46, 679.54, 702–712; 165/80.3, 104.33, 185; 257/77, 276, 257/706, 717, 720, 796; 524/86, 99, 595, 524/871, 875, 495, 496, 543; 427/249.1, 427/301, 903, 294, 307, 309; 428/338, 339, 428/201, 195, 298.1, 332, 323, 408, 320.2, 428/614, 634, 402; 977/934, 939, 942
See application file for complete search history.

(56) References Cited

U.S. PATENT DOCUMENTS

| 5,604,037 A | 2/1997 | Ting et al. |
| 5,660,917 A * | 8/1997 | Fujimori et al. ........... 428/195.1 |

(Continued)

FOREIGN PATENT DOCUMENTS

| CN | 1846983 | 10/2006 |
| CN | 1944698 | 4/2007 |

(Continued)

OTHER PUBLICATIONS

"Japanese Office Action" mailed by JPO and corresponding to Japanese application No. 2008292320 on Jul. 24, 2012, with English translation.

(Continued)

*Primary Examiner* — Michail V Datskovskiy
(74) *Attorney, Agent, or Firm* — Fujitsu Patent Center

(57) ABSTRACT

The electronic device includes a heat generator 54, a heat radiator 58, and a heat radiation material 56 disposed between the heat generator 54 and the heat radiator 58 and including a plurality of linear structures 12 of carbon atoms and a filling layer 14 formed of a thermoplastic resin and disposed between the plurality of linear structures 12.

7 Claims, 25 Drawing Sheets

(51) Int. Cl.
*H01L 23/373* (2006.01)
*H01L 23/00* (2006.01)

(52) U.S. Cl.
CPC ............ *H01L 24/31* (2013.01); *H01L 23/3733* (2013.01); *H01L 2224/16225* (2013.01); *H01L 2224/73253* (2013.01); *H01L 2924/01005* (2013.01); *H01L 2924/01012* (2013.01); *H01L 2924/01013* (2013.01); *H01L 2924/01018* (2013.01); *H01L 2924/01027* (2013.01); *H01L 2924/01029* (2013.01); *H01L 2924/01033* (2013.01); *H01L 2924/0104* (2013.01); *H01L 2924/01042* (2013.01); *H01L 2924/01046* (2013.01); *H01L 2924/01047* (2013.01); *H01L 2924/01049* (2013.01); *H01L 2924/0105* (2013.01); *H01L 2924/01073* (2013.01); *H01L 2924/01074* (2013.01); *H01L 2924/01078* (2013.01); *H01L 2924/01079* (2013.01); *H01L 2924/04941* (2013.01); *H01L 2924/04953* (2013.01); *H01L 2924/10158* (2013.01); *H01L 2924/16152* (2013.01); *H01L 2924/01006* (2013.01); *H01L 2924/01019* (2013.01); *H01L 2924/01023* (2013.01); *H01L 2924/01041* (2013.01); *H01L 2924/01072* (2013.01); *H01L 2924/014* (2013.01); *Y10S 977/742* (2013.01); *Y10S 977/734* (2013.01); *Y10S 977/739* (2013.01)
USPC ........... 361/708; 361/705; 361/709; 361/710; 361/704; 361/679.54; 165/80.2; 165/80.3; 165/104.33; 165/185; 438/106; 438/122; 428/408; 428/411.1; 977/739; 977/742; 977/734; 977/739

(56) References Cited

U.S. PATENT DOCUMENTS

| | | | |
|---|---|---|---|
| 6,261,485 B1 | 7/2001 | Klett | |
| 6,311,769 B1* | 11/2001 | Bonneville et al. | 165/185 |
| 6,383,923 B1 | 5/2002 | Brown et al. | |
| 6,676,796 B2* | 1/2004 | Pinter et al. | 156/289 |
| 6,730,731 B2* | 5/2004 | Tobita et al. | 524/495 |
| 6,740,972 B2* | 5/2004 | Smith et al. | 257/746 |
| 6,808,798 B2* | 10/2004 | Tobita | 428/298.1 |
| 6,965,513 B2 | 11/2005 | Montgomery et al. | |
| 7,132,161 B2 | 11/2006 | Knowles et al. | |
| 7,168,484 B2 | 1/2007 | Zhang et al. | |
| 7,180,174 B2 | 2/2007 | Koning et al. | |
| 7,279,916 B2 | 10/2007 | Suhir | |
| 7,291,396 B2 | 11/2007 | Huang et al. | |
| 7,393,428 B2 | 7/2008 | Huang et al. | |
| 7,396,477 B2 | 7/2008 | Hsiao | |
| 7,416,019 B2 | 8/2008 | Osiander et al. | |
| 7,438,844 B2 | 10/2008 | Huang et al. | |
| 7,456,052 B2 | 11/2008 | White et al. | |
| 7,462,309 B2 | 12/2008 | Miller et al. | |
| 7,504,453 B2* | 3/2009 | Hu et al. | 524/495 |
| 7,560,817 B2 | 7/2009 | Basavanhally et al. | |
| 7,674,410 B2 | 3/2010 | Huang et al. | |
| 7,692,249 B2 | 4/2010 | Zhang | |
| 7,955,644 B2 | 6/2011 | Sansom et al. | |
| 7,985,627 B2 | 7/2011 | White et al. | |
| 7,988,896 B2 | 8/2011 | Zhang et al. | |
| 7,993,750 B2 | 8/2011 | Wang et al. | |
| 8,029,900 B2 | 10/2011 | Wu et al. | |
| 8,138,239 B2* | 3/2012 | Prack et al. | 523/223 |
| 8,691,368 B2* | 4/2014 | Ohta et al. | 428/201 |
| 2003/0083413 A1* | 5/2003 | Stumphauzer | 524/296 |
| 2004/0009353 A1 | 1/2004 | Knowles et al. | |
| 2004/0097635 A1* | 5/2004 | Fan et al. | 524/496 |
| 2004/0265489 A1* | 12/2004 | Dubin | 427/212 |
| 2004/0265755 A1 | 12/2004 | Park et al. | |
| 2004/0266065 A1 | 12/2004 | Zhang et al. | |
| 2005/0145367 A1* | 7/2005 | Hannah et al. | 165/80.3 |
| 2005/0228097 A1 | 10/2005 | Zhong | |
| 2006/0231946 A1 | 10/2006 | Pan et al. | |
| 2006/0234056 A1 | 10/2006 | Huang et al. | |
| 2006/0251897 A1 | 11/2006 | Pan et al. | |
| 2006/0258054 A1 | 11/2006 | Pan et al. | |
| 2007/0004081 A1* | 1/2007 | Hsiao | 438/106 |
| 2007/0116626 A1 | 5/2007 | Pan et al. | |
| 2007/0155136 A1 | 7/2007 | Chrysler et al. | |
| 2007/0155138 A1 | 7/2007 | Tomasini et al. | |
| 2007/0161729 A1* | 7/2007 | Chiou et al. | 524/356 |
| 2007/0244245 A1* | 10/2007 | Liu et al. | 524/496 |
| 2008/0001284 A1 | 1/2008 | Yuen et al. | |
| 2008/0007890 A1* | 1/2008 | Harmon et al. | 361/321.5 |
| 2008/0019097 A1 | 1/2008 | Zhang et al. | |
| 2008/0102266 A1 | 5/2008 | Nakatsuka et al. | |
| 2008/0241486 A1 | 10/2008 | Ishikawa et al. | |
| 2009/0016951 A1 | 1/2009 | Kawabata et al. | |
| 2009/0143524 A1* | 6/2009 | Nakayama et al. | 524/450 |
| 2009/0146292 A1* | 6/2009 | Drake et al. | 257/712 |
| 2009/0233092 A1* | 9/2009 | Hara et al. | 428/339 |
| 2009/0286075 A1* | 11/2009 | Nakamura et al. | 428/338 |
| 2010/0021736 A1 | 1/2010 | Slinker et al. | |
| 2010/0172101 A1* | 7/2010 | Yao et al. | 361/704 |
| 2010/0243227 A1 | 9/2010 | Wu et al. | |

FOREIGN PATENT DOCUMENTS

| | | | |
|---|---|---|---|
| EP | 1865553 | 12/2007 | |
| JP | 2000191987 A * | 12/1998 | ............ H01L 23/36 |
| JP | 2005-150362 A | 6/2005 | |
| JP | 2006-147801 A | 6/2006 | |
| JP | 2006-270041 | 10/2006 | |
| JP | 2006-290736 A | 10/2006 | |
| JP | 2006-295120 | 10/2006 | |
| JP | 2007-009213 A | 1/2007 | |
| JP | 2008208316 A * | 2/2007 | ............... C08L 1/00 |

OTHER PUBLICATIONS

Korean Office Action mailed May 15, 2012 for corresponding Korean Application No. 10-2009-0088419, with English-language Translation.
"Chinese Office Action", English-language Translation, mailed Apr. 12, 2011 for corresponding Chinese Application No. 200910207927.1.
"European Extended Search Report", mailed by EPO and corresponding to European application No. 09173510.0 on Sep. 23, 2010.
"Korean Office Action", English-language Translation, mailed Apr. 27, 2011 for corresponding Korean Application No. 10-2009-0088419.
USPTO, (Datskovskiy) Corrected Notice of Allowability, Feb. 27, 2012, in parent U.S. Appl. No. 12/614,063 [pending].
USPTO, (Datskovskiy) Notice of Allowance and Notice of Allowability, Feb. 21, 2012, in parent U.S. Appl. No. 12/614,063 [pending].
USPTO, (Datskovskiy) Non-Final Action, Nov. 22, 2011, in parent U.S. Appl. No. 12/614,063 [pending].
USPTO, (Datskovskiy) Non-Final Action, Jul. 22, 2011, in parent U.S. Appl. No. 12/614,063 [pending].
USPTO, (Datskovskiy) Non-Final Action, Mar. 4, 2011, in parent U.S. Appl. No. 12/614,063 [pending].
USPTO, (Datskovskiy) Restriction Requirement, Jan. 14, 2011, in parent U.S. Appl. No. 12/614,063 [pending].

* cited by examiner

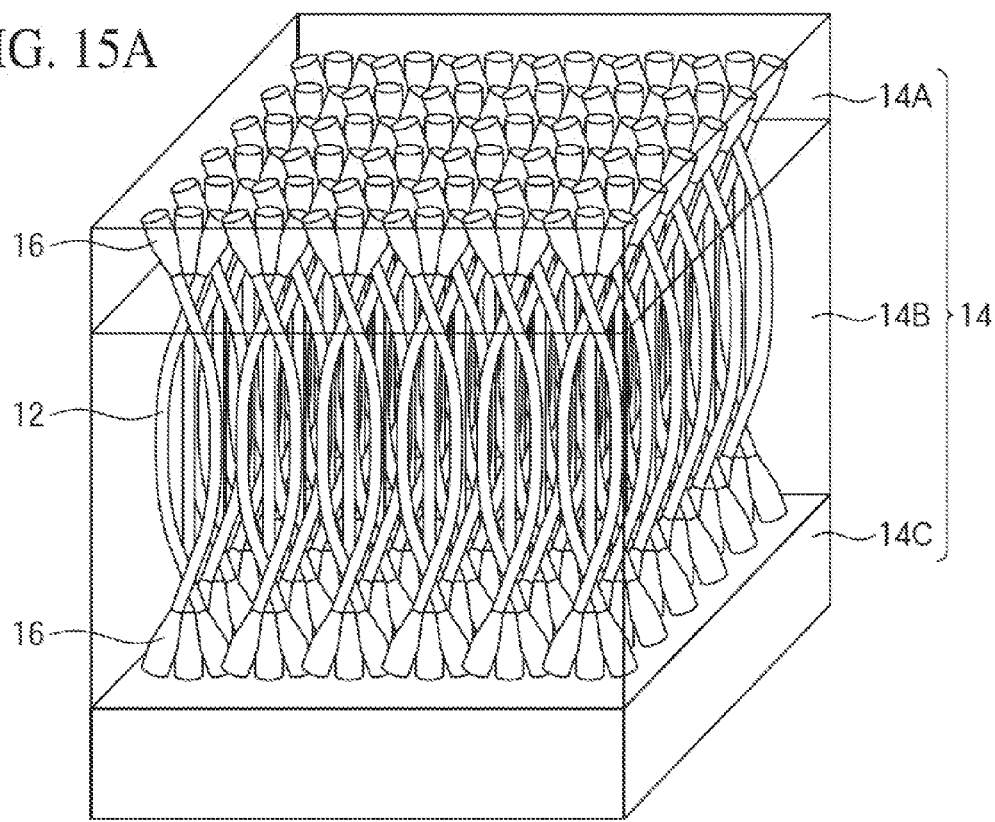
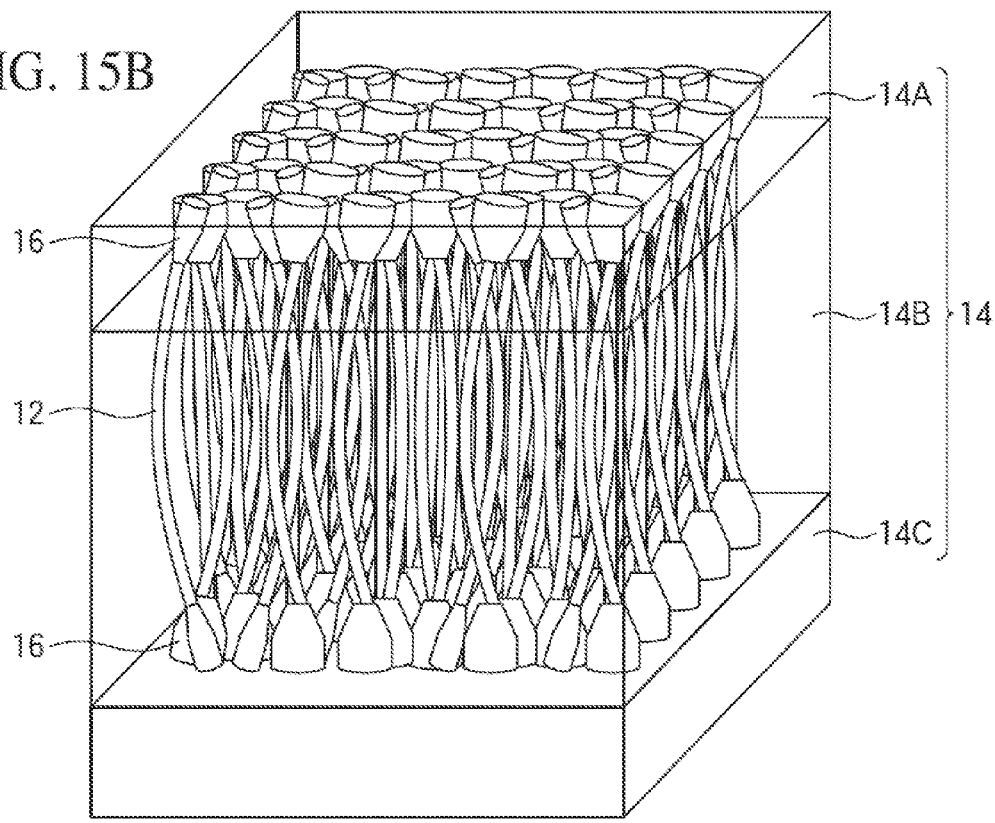

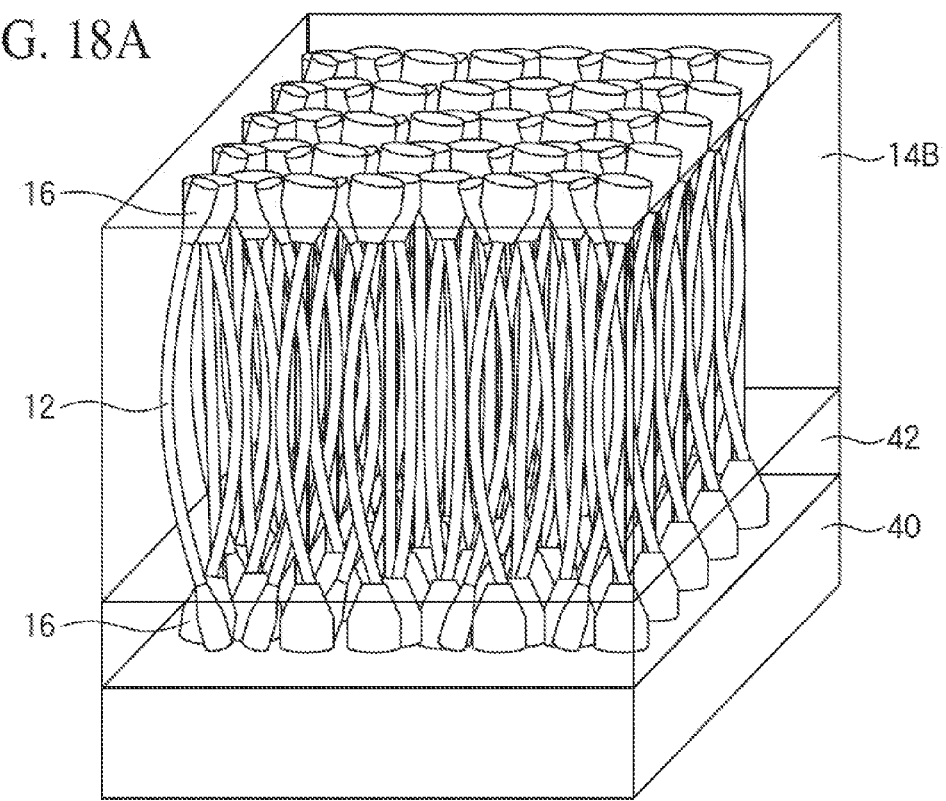
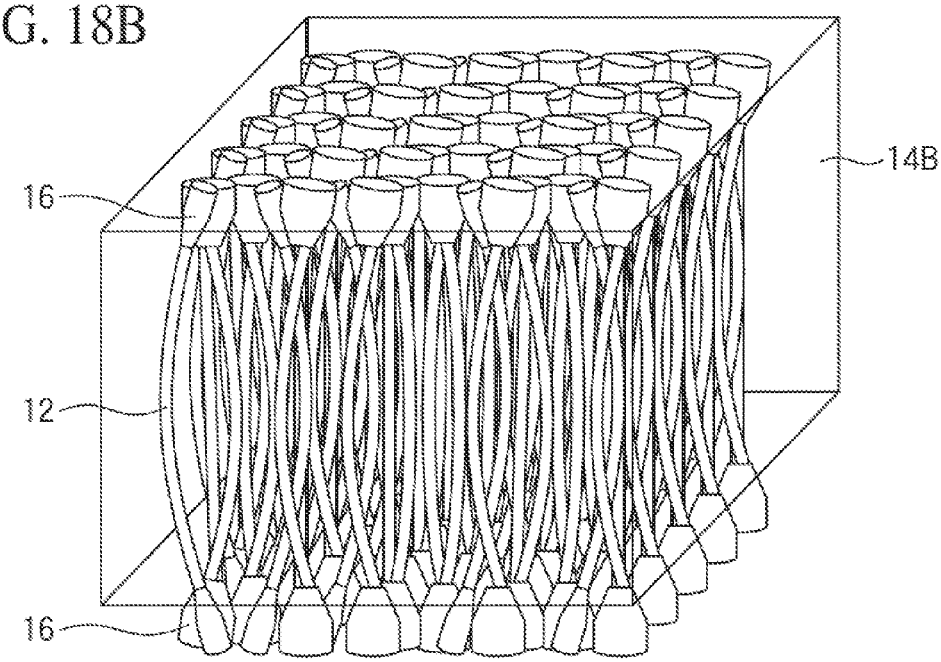

HEAT RADIATION MATERIAL, ELECTRONIC DEVICE AND METHOD OF MANUFACTURING ELECTRONIC DEVICE

CROSS-REFERENCE TO RELATED APPLICATIONS

This application is a divisional of application Ser. No. 12/614,063, filed Nov. 6, 2009, which is based upon and claims the benefit of priority of the prior Japanese Patent Application No. 2008-292320, filed on Nov. 14, 2008, the entire contents of which are incorporated herein by reference.

FIELD

The embodiments discussed herein are related to a heat radiation material, more specifically, a heat radiation material including linear structures of carbon atoms, and an electronic device using such the heat radiation material and a method of manufacturing the electronic device.

BACKGROUND

The electronic parts used in the CPUs (Central Processing Units) of servers and personal computers, etc. are required to effectively radiate heat generated by the semiconductor elements. To this end, is used the structure that a heat spreader of a material of high thermal conductivity, such as copper or another, is disposed over the semiconductor element with a thermal interface material disposed on the semiconductor element.

The thermal interface material itself is required to be a material of high thermal conductivity and furthermore is required to have the characteristic that the material is able to contact in large areas with minute concavities and convexities of the surfaces of the heat generation source and the heat spreader. At present, as the thermal interface material, PCM (Phase Change Material), indium, etc. are generally used.

However, PCM has good contact to the minute concavities and convexities but has low thermal conductivity (about 1 [W/m·K]~5 [W/m·K]). For PCM to have effective thermal conductivity, the film thickness must be thin. Between the heat generation source and the heat spreader, gaps take place due to the thermal expansion coefficient difference, and the film thinning is too limited to absorb the concavities and convexities in accordance with the gaps.

The recent large increase of the demand for rare metal has raised the indium price, and substitute materials which are less expensive than indium are expected. In terms of the physical properties, the thermal conductivity of indium (about 50 [W/m·K]) cannot be said high. Materials having higher thermal conductivities are expected so as to effectively radiate the heat generated from semiconductor elements.

In such background, linear structures of carbon atoms represented by carbon nanotubes are noted as a material having higher thermal conductivity than PCM and indium. The carbon nanotubes not only have a very high thermal conductivity (about 1500 [W/m·K]), but also is superior in flexibility and heat resistance. The carbon nanotubes have highly potential as a heat radiation material.

As heat conductive sheets using carbon nanotubes are proposed a heat conductive sheet having carbon nanotubes dispersed in a resin, and a heat conductive sheet having carbon nanotubes grown, oriented on a substrate, which are buried in a resin.

The following are examples of related art of the present invention: Japanese Laid-open Patent Publication No. 2005-150362, Japanese Laid-open Patent Publication No. 2006-147801, and Japanese Laid-open Patent Publication No. 2006-290736.

However, the conventional heat radiation materials using carbon nanotubes have not been able to sufficiently utilize the high thermal conductivity of the carbon nanotubes.

SUMMARY

According to one aspect of an embodiment, there is provided a heat radiation material including a plurality of linear structures of carbon atoms, and a filling layer formed of a thermoplastic resin and disposed between the plurality of linear structures.

According to another aspect of an embodiment, there is provided an electronic device including a heat generator, a heat radiator, and a heat radiation material disposed between the heat generator and the heat radiator and comprising a plurality of linear structures of carbon atoms and a filling layer formed of a thermoplastic resin and disposed between the plurality of linear structures.

According to further another aspect of an embodiment, there is provided a method of manufacturing an electronic device including disposing between a heat generator and a heat radiator a heat radiation material including a plurality of linear structures of carbon atoms, and a filling layer formed of a thermoplastic resin and disposed between the plurality of linear structures, heating the heat radiation material to melt the thermoplastic resin, and cooling the heat radiation material to set the thermoplastic resin.

According to further another aspect of an embodiment, there is provided a heat radiation component including a heat radiator, and a heat radiation material formed on the heat radiator, and including a plurality of linear structures of carbon atoms, and a filling layer formed of a thermoplastic resin and disposed between the plurality of linear structures.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 15A and 15B are perspective views illustrating structures of a carbon nanotube sheet according to a fourth embodiment;

FIGS. 16A-16B, 17A-17B, 18A-18B and 19 are perspective views illustrating a method of manufacturing the carbon nanotube sheet according to the fourth embodiment;

FIGS. 17A-17B are perspective views illustrating a method of manufacturing the carbon nanotube sheet according to the fourth embodiment;

FIGS. 18A-18B are perspective views illustrating a method of manufacturing the carbon nanotube sheet according to the fourth embodiment;

FIG. 19 is a perspective view illustrating a method of manufacturing the carbon nanotube sheet according to the fourth embodiment;

DESCRIPTION OF EMBODIMENTS

[A First Embodiment]

The carbon nanotube sheet and method of manufacturing the carbon nanotube sheet according to a first embodiment will be explained with reference to FIGS. 1A to 3C.

Figure 1A:
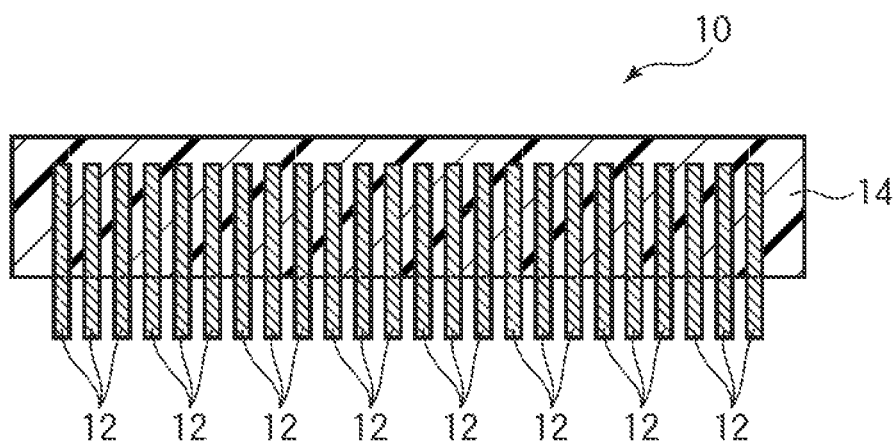
FIGS. 1A and 1B are diagrammatic sectional views illustrating structures of a carbon nanotube sheet according to a first embodiment.
Figure 1B:
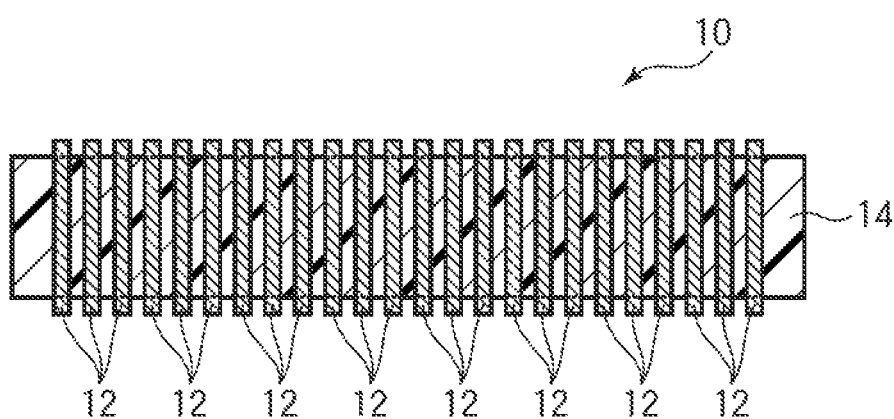

FIGS. 1A and 1B are diagrammatic sectional views illustrating structures of a carbon nanotube sheet according to the present embodiment. FIGS. 2A-3C are sectional views illustrating a method of manufacturing the carbon nanotube sheet according to the present embodiment.

First, the structure of the carbon nanotube sheet according to the present embodiment will be explained with reference to FIGS. 1A and 1B. FIG. 1A is a view illustrating a structure of a first example of the carbon nanotube sheet according to the present embodiment. FIG. 1B is a view illustrating a structure of a second example of the carbon nanotube sheet according to the present embodiment.

As illustrated in FIGS. 1A and 1B, the carbon nanotube sheet according to the present embodiment includes a plurality of carbon nanotubes 12 arranged, spaced from each other. A filling layer 14 of a thermoplastic resin material is formed in the gaps between the carbon nanotubes 12 and supports the carbon nanotubes 12. The carbon nanotube sheet 10 according to the present embodiment has a sheet structure, and the carbon nanotubes 12 are oriented in the film thickness-wise of the sheet, i.e., in the direction intersecting the surface of the sheet.

The carbon nanotubes 12 may be single-walled carbon nanotubes or multi-walled carbon nanotubes. The density of the carbon nanotubes 12 is not especially limited but can be set preferably at not less than about $1 \times 10^{10}$ tubes/cm$^2$ from the view point of heat radiation and electric conduction.

The length of the carbon nanotubes 12 may be determined by applications of the carbon nanotube sheet 10. It is not especially limited but can be set preferably at a value of about 5-500 μm. In using the carbon nanotube sheet 10 as a thermal interface material formed between a heat generation source (e.g., semiconductor elements) and a heat radiation member (e.g., a heat spreader), the length of the carbon nanotubes 12 preferably is not less than a length, which fills the concavities and convexities of at least the heat generation source and the heat radiation member.

As illustrated in FIGS. 1A and 1B, the carbon nanotube sheet 10 according to the present embodiment has at least one ends exposed. The carbon nanotube sheet illustrated in FIG. 1A has one ends of the carbon nanotubes 12 exposed. The carbon nanotube sheet illustrated in FIG. 1B has both ends of the carbon nanotubes 12 exposed.

Thus, when the carbon nanotube sheet 10 is brought into contact with the heat radiator or the heat generator, the carbon nanotubes 12 are in direct contact with the heat radiator or the heat generator, whereby the thermal conductive efficiency can be drastically increased. The carbon nanotubes 12, which have also electric conductivity, have both ends exposed so as to be used as interconnection bodies passed through the sheet. That is, the carbon nanotube sheet 10 according to the present embodiment can be used not only as a thermal conductive sheet but also as a vertical interconnection sheet.

The filling layer 14 is formed of a thermoplastic resin. The thermoplastic resin changes the phase reversibly between liquid and solid in accordance with temperatures. The thermoplastic resin is not specifically limited as far as it is solid at room temperature, and it changes to liquid by heating and, by cooling, returns to solid, exhibiting adhesiveness.

Such thermoplastic resin is, e.g., the hot melt resins to be described below. As polyamide-based hot melt resin, "Micromelt 6239" (softening point temperature: 140° C.) from Henkel Japan Ltd., for example, may be applied. As polyester-based hot melt resin, "DH598B" (softening point temperature: 133° C.) from Nogawa Chemical Co., Ltd., for example, may be applied. As polyurethane-based hot melt resin, "DH722B" from Nogawa Chemical Co., Ltd., for example, may be applied. As polyolefin-based hot melt resin, "EP-90" (softening point temperature: 148° C.) from Matsumura Oil Co., Ltd., for example, may be applied. As ethylene copolymer hot melt resin, "DA574B" (softening point temperature: 105° C.) from Nogawa Chemical Co., Ltd., for example, may be applied. As SBR-based hot melt resin, "M-6250" (softening point temperature: 125° C.) from Yokohama Rubber Co., Ltd., for example, may be applied. As EVA-based hot melt resin, "3747" (softening point temperature: 104° C.) from Sumitomo 3M Ltd., for example, may be applied. As butyl rubber-based hot melt resin, "M-6158" from Yokohama Rubber Co., Ltd., for example, may be applied.

The thermoplastic resin forming the filling layer 14 can be selected based on the melting temperatures of the thermoplastic resins in accordance with uses of the carbon nanotube sheet 10. It is preferable that the lower limit value of the melting temperature of the thermoplastic resin is higher than the upper limit value of the heating temperature in operation. This is because when the thermoplastic resin melts in operation, there is a risk that the carbon nanotube sheet 10 may be deformed, the orientation of the carbon nanotubes 12 may be damaged, and resultantly the thermal conductivity may be lowered. The upper limit value of the melting temperature of the thermoplastic resin is lower than the lower limit value of the thermal resistance temperatures of the heat generator and the heat radiator. The carbon nanotube sheet 10 according to the present embodiment is preferably reflowed after brought into contact with the heat radiator and the heat generator. This is because when the melting temperature of the thermoplastic resin is higher than the thermal resistance temperature, the reflow is difficult without damaging the heat generator and/or the heat radiator. The reflow of the carbon nanotube sheet 10 will be detailed later.

For example, when the carbon nanotube sheet 10 is used in the heat radiation of the electronic devices, such as CPU, etc., thermoplastic resins whose melting temperatures are about 125° C.~250° C. are suitable in consideration that the upper limit of the heating temperature of the CPU in operation is 125° C., and the heat resistance temperature of CPU electronic members is about 250° C. For example, for the use of the exhaust system, etc. of automobile engines, thermoplastic resins whose melting temperature is about 600° C.~900° C. are suitable in consideration that the heating temperature is about 500° C.~800° C. although depending on parts.

In the filling layer 14, additives may be mixed dispersed as required. As the additives, for example, substances of high thermal conductivity and substances of high electric conductivity may be considered. Additives of high thermal conductivity are mixed dispersed in the filling layer 14 portion, whereby the thermal conductivity of the filling layer 14 portion can be improved, and the thermal conductivity of the carbon nanotube sheet 10 as a whole can be improved. When the carbon nanotube sheet is used as an electric conductive sheet, an additive of high electric conductivity is mixed dispersed in the filling layer 14 portion, whereby the electric conductivity of the carbon nanotube sheet 10 as a whole can be improved. As material of high thermal conductivity, carbon nanotubes, metal material, aluminum nitride, silica, alumina, graphite, fullerene, etc. can be used. As materials of high electric conductivity, carbon nanotubes, metal materials, etc. can be used.

Next, the method of manufacturing the carbon nanotube sheet according to the present embodiment will be explained with reference to FIGS. 2A-3C.

Figure 2A:
FIGS. 2A-2C are sectional views illustrating a method of manufacturing the carbon nanotube sheet according to the first embodiment.

First, a substrate 30 to be used as the base for forming the carbon nanotube sheet 10 is prepared (FIG. 2A). The substrate 30 can be a semiconductor substrate, such as a silicon substrate or others, an insulating substrate, such as an alumina (sapphire) substrate, an MgO substrate, a glass substrate or others, a metal substrate or others. The substrate 30 can be such substrate with a thin film formed on. For example, a silicon substrate with an about 300 nm-thickness silicon oxide film may be used.

The substrate 30 is peeled off after the carbon nanotubes 12 have been grown. To this end, it is preferable that the substrate 30 is not deformed at a growth temperature of the carbon nanotubes 12. Also it is preferable that at least the surface of the substrate 30, which is in contact with the carbon nanotubes, is formed of a material which permits the surface to be easily peeled from the carbon nanotubes 12. It is also preferable that the substrate 30 is formed of a material which can be etched selectively with respective to the carbon nanotubes 12.

Figure 2B:
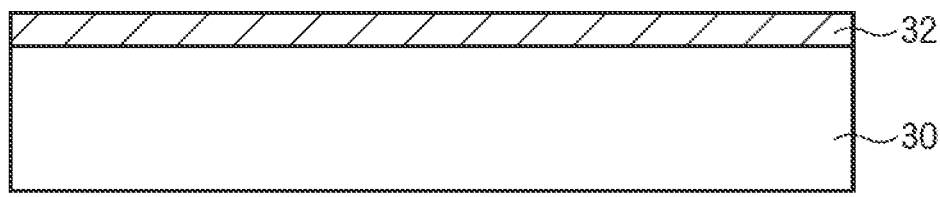

Then, over the substrate 30, an Fe (iron) film of a 2.5 nm-thickness, for example, is formed by, e.g., sputtering method to form a catalyst metal film 32 of Fe (FIG. 2B). The catalyst metal film 32 may not be formed essentially all over the substrate and may be formed selectively over prescribed regions of the substrate 30 by, e.g., lift-off method.

The catalyst metal can be, other than Fe, Co (cobalt), Ni (nickel), Au (gold), Ag (silver), Pt (platinum) or an alloy containing at least one of them. As the catalyst, other than the metal film, metal particles prepared with the size controlled in advance with a DMA (Differential Mobility Analyzer) or others may be used. In this case, the metal species can be the same as those of the thin film.

As the base film of these catalyst metals, films of Mo (molybdenum), Ti (titanium), Hf (hafnium) Zr (zirconium), Nb (niobium), V (vanadium), TaN (tantalum nitride), $TiSi_x$ (titanium silicide), Al (aluminum), $Al_2O_3$ (aluminum oxide), $TiO_x$ (titanium oxide), Ta (tantalum), W (tungsten), Cu (copper), Au (gold), Pt (platinum), Pd (palladium), TiN (titanium nitride), etc. and an alloy containing at least one of them may be formed. For example, the layer structure of Fe (2.5 nm)/Al (10 nm), the layer structure of Co (2.6 nm)/TiN (5 nm), etc. can be used. When the metal particles are used, the layer structure of, e.g., Co (average diameter: 3.8 nm)/TiN (5 nm), etc. can be used.

Then, over the substrate 30, the carbon nanotubes 12 are grown with the catalyst metal film 32 as the catalyst by, e.g., hot filament CVD method. The growth conditions for the carbon nanotubes 12 are, e.g., an acetylene-argon mixed gas (partial pressure ratio: 1:9) as the raw material gas, 1 kPa total gas pressure in the film forming chamber, 1000° C. hot filament temperature, 25 minute growth period of time. Thus, multi-walled carbon nanotubes of 3-6 layers (average: about 4 walls), 4 nm~8 nm diameter (average: 6 nm) can be grown. The carbon nanotubes can be grown by another film forming process, such as thermal CVD method, remote plasma CVD method or others. The carbon nanotubes may be grown in a single-walled. As the carbon raw material, other than acetylene, hydrocarbons, such as methane, ethylene, etc. or alcohols, such as ethanol, methanol, etc. may be used.

The length of the carbon nanotubes 12 is determined depending on an application of the carbon nanotube sheet 10 and is not specifically limited, but can be set preferably at a value of about 5 μm~500 μm. In using the carbon nanotube sheet 10 as the thermal interface material to be formed between a heat generation source (e.g., semiconductor elements) and a heat radiation member (e.g., heat spreader), the carbon nanotubes 12 have preferably a length that fills at least the concavities and convexities in the surfaces of the heat generation source and the heat radiation member.

Figure 2C:
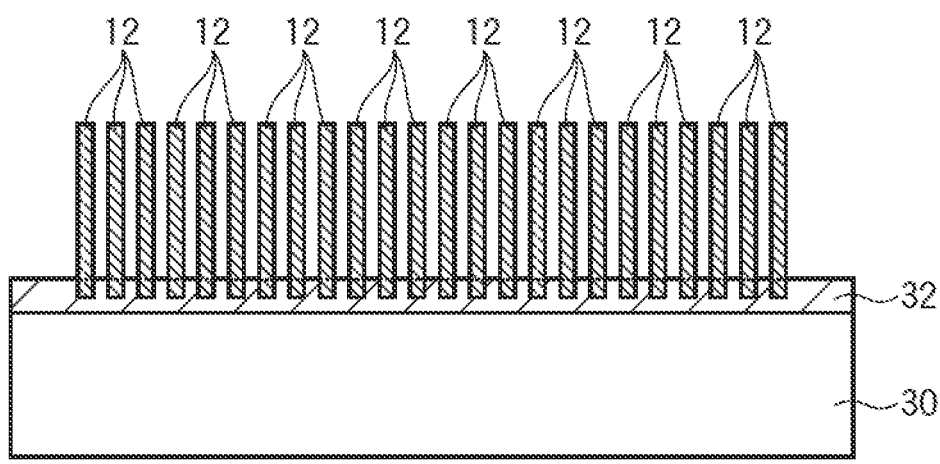

Thus, over the substrate 30, a plurality of the carbon nanotubes 12 are formed, oriented in the normal direction of the substrate (vertically oriented) (FIG. 2C). The surface density of the carbon nanotubes 12 formed under the above growth conditions was about $1 \times 10^{11}$ tubes/cm². This corresponds to that the carbon nanotubes 12 are formed in a region which is 10% of an area of the surface of the substrate 30.

Figure 3A:
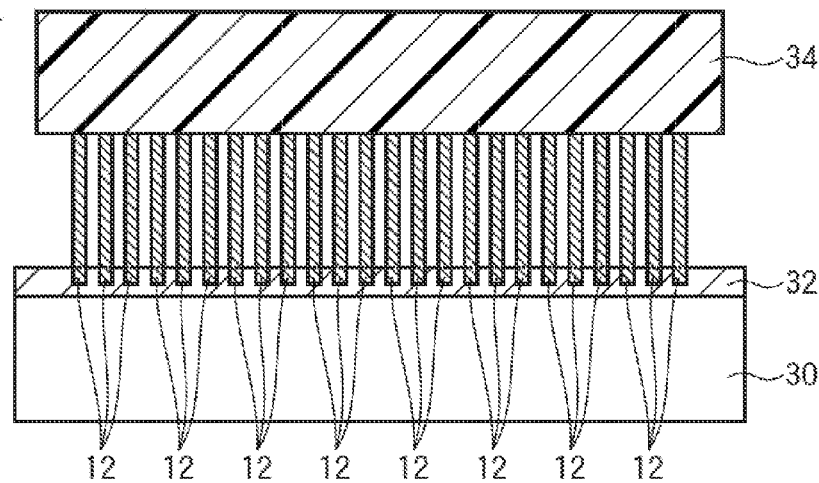
FIGS. 3A-3C are sectional views illustrating a method of manufacturing the carbon nanotube sheet according to the first embodiment.

Next, on the carbon nanotubes 12 grown over the substrate 30, a thermoplastic resin processing in film (a thermoplastic resin film 34) is mounted (FIG. 3A). The film thickness of the thermoplastic resin film is set suitably depending on a length of the carbon nanotubes 12. For example, when the carbon nanotube sheet 10 of FIG. 1A is formed, the thermoplastic resin film 34 is formed preferably in a thickness that is about equal to a length of the carbon nanotubes 12, e.g., about 5 μm~500 μm. When the carbon nanotube sheet 10 of FIG. 1B is formed, the thermoplastic resin film 34 is formed preferably in a thickness that is little thin than a length of the carbon nanotubes 12, e.g., about 4 μm~400 μm.

The thermoplastic resin of the thermoplastic resin film 34 can be, e.g., hot melt resins described below. As polyamide-based hot melt resin, "Micromelt 6239" (softening point temperature: 140° C.) from Henkel Japan Ltd., for example, may be applied. As polyester-based hot melt resin, "DH598B" (softening point temperature: 133° C.) from Nogawa Chemical Co., Ltd., for example, may be applied. As polyurethane-based hot melt resin, "DH722B" from Nogawa Chemical Co., Ltd., for example, may be applied. As polyolefin-based hot melt resin, "EP~90" (softening point temperature: 148° C.) from Matsumura Oil Co., Ltd., for example, may be applied. As ethylene copolymer hot melt resin, "DA574B" (softening point temperature: 105° C.) from Nogawa Chemical Co., Ltd., for example, may be applied. As SBR-based hot melt resin, "M-6250" (softening point temperature: 125° C.) from Yokohama Rubber Co., Ltd., for example, may be applied. As EVA-based hot melt resin, "3747" (softening point temperature: 104° C.) from Sumitomo 3M Ltd., for example, may be applied. As butyl rubber-based hot melt resin, "M-6158" from Yokohama Rubber Co., Ltd., for example, may be applied.

Here, one example that the thermoplastic resin film 34 of "Micromelt 6239" from Henkel Japan Ltd. processed in a 100 μm-thickness is used will be explained. "Micromelt 6239" is a hot melt resin whose melting temperature is 135° C.~145° C. and whose viscosity when melted is 5.5 Pa·s~8.5 Pa·s (225° C.).

Then, the substrate 30 with the thermoplastic resin film 34 mounted on is heated at, e.g., 195° C. Thus, the thermoplastic resin of the thermoplastic resin film 34 is melted and gradually penetrated into the gaps between the carbon nanotubes 12. The thermoplastic resin film 34 is thus penetrated to the extent that the thermoplastic resin film 34 does not arrive at the surface of the substrate 30.

The thermoplastic resin is process in film in advance, whereby a filling quantity can be controlled by a thickness of the film. Thus, by controlling the heating temperature and the heating period of time, the filling material can be controlled not penetrate down to the substrate 30.

The penetration of the thermoplastic resin film 34 is stopped to the extent that the thermoplastic resin film 34 does not arrive at the substrate 30, so that the carbon nanotube sheet 10 can be easily peeled from the substrate 30. In a case that the carbon nanotube sheet 10 can be easily peeled from the substrate 30, the thermoplastic resin film 34 maybe penetrated down to the substrate 30.

The film thickness of the thermoplastic resin film 34 penetrating in the gaps between the carbon nanotubes 12 can be controlled by the heat processing period of time. For example, for the carbon nanotubes 12 of a 100 μm-length grown under the above-described conditions, the heat processing is made at 195° C. for 1 minute, whereby the thermoplastic resin film 34 can be penetrated to the extent that the thermoplastic resin film 34 does not arrive at the substrate 30.

It is preferable that the heating period of time of the thermoplastic resin film 34 is suitably set corresponding to the length of the carbon nanotubes 12, a viscosity of the molten thermoplastic resin, a film thickness of the thermoplastic resin film 34, etc. so that the thermoplastic resin film 34 penetrates to the extent that the film 34 does not arrive at the substrate 30.

It is suitable that the shape of the thermoplastic resin is processed in film in advance, and the thermoplastic resin may be processed in pellets or rods.

Then, after the thermoplastic resin film 34 has been penetrated to a prescribed position, the thermoplastic resin film 34 is cooled to room temperature to set the thermoplastic resin film 34. Thus, the filling layer 14 formed of the thermoplastic resin of the thermoplastic resin film and filled in the gaps between the carbon nanotubes 12 is formed.

Figure 3B:
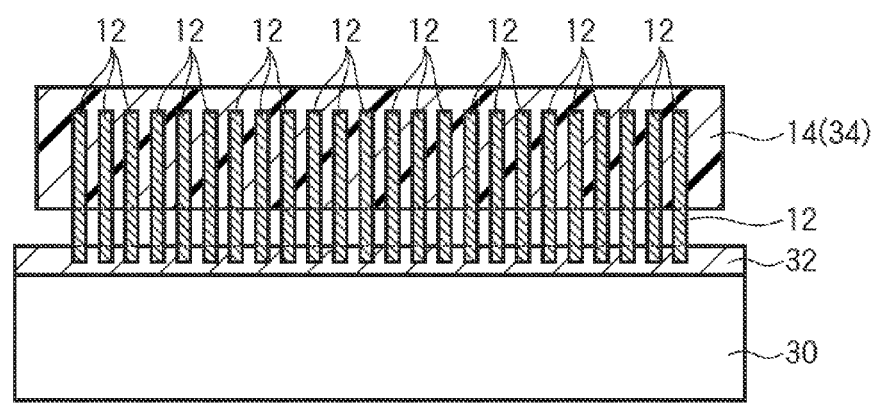
Figure 3C:
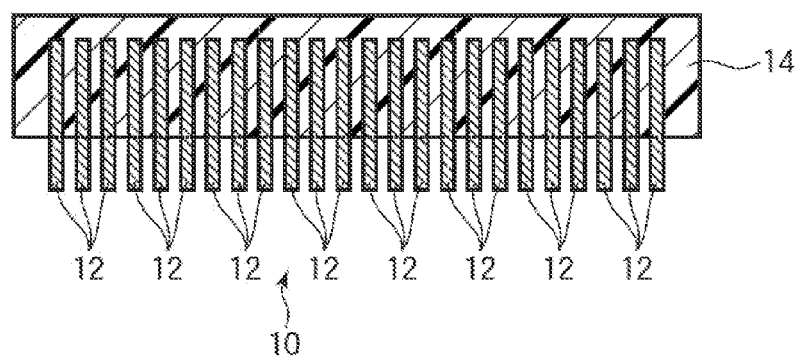

Then, the carbon nanotubes 12 and the filling layer 14 are peeled from the substrate 30, and the carbon nanotube sheet according to the present embodiment is obtained (FIG. 3C). The filling layer 14 (the thermoplastic resin film 34) is formed, not arriving at the substrate 30 as described above, whereby the junction between the carbon nanotubes 12 and the substrate 30 is weak, and the carbon nanotubes 12 and the filling layer 14 can be easily peeled from the substrate 30.

When the carbon nanotube sheet illustrated in FIG. 1B is manufactured, the thermoplastic resin film 34 having the thickness smaller than the length of the carbon nanotubes 12 is used, and the thermoplastic resin film 34 is penetrated until the upper ends of the carbon nanotubes 12 are exposed.

As described above, according to the present embodiment, a thermoplastic resin is used as the material of the filling layer supporting the carbon nanotubes, whereby the carbon nanotube sheet having the filling layer which can reflow and having small thermal contact resistance can be easily formed. The penetration quantity of the filling material can be easily controlled by the heat processing temperature and the heat processing period of time. Thus, the ends of the carbon nanotubes can be easily exposed. Also, the sheet can be easily peeled from the substrate.

[A Second Embodiment]

The carbon nanotube sheet and the method of manufacturing the carbon nanotube sheet according to a second embodiment will be explained with reference to FIGS. 4 to 8. The same members of the present embodiment as those of the carbon nanotube sheet and the method of manufacturing the carbon nanotube sheet according to the first embodiment illustrated in FIGS. 1A to 3C are represented by the same reference numbers not to repeat or to simplify their explanation.

Figure 4:
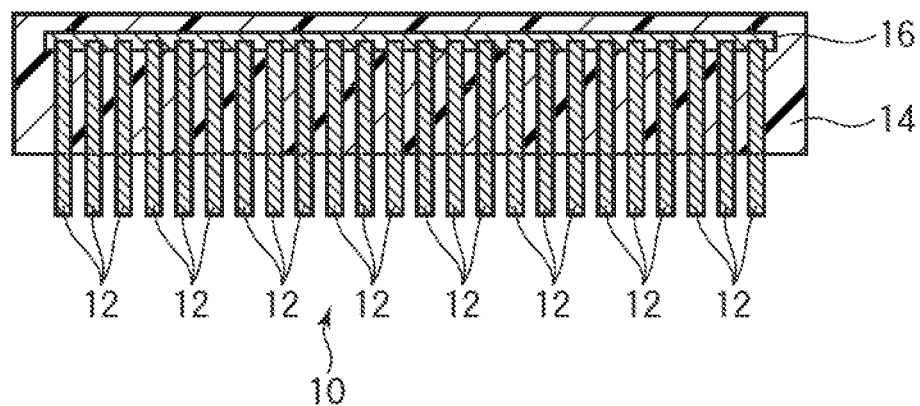
FIG. 4 is a diagrammatic sectional view illustrating a structure of a carbon nanotube sheet according to a second embodiment.
Figure 5A:
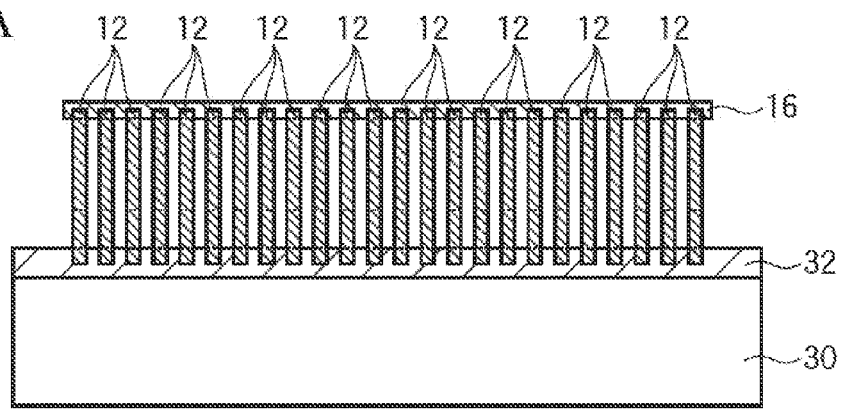
FIGS. 5A-5C are sectional views illustrating a method of manufacturing the carbon nanotube sheet according to the second embodiment.
Figure 5B:
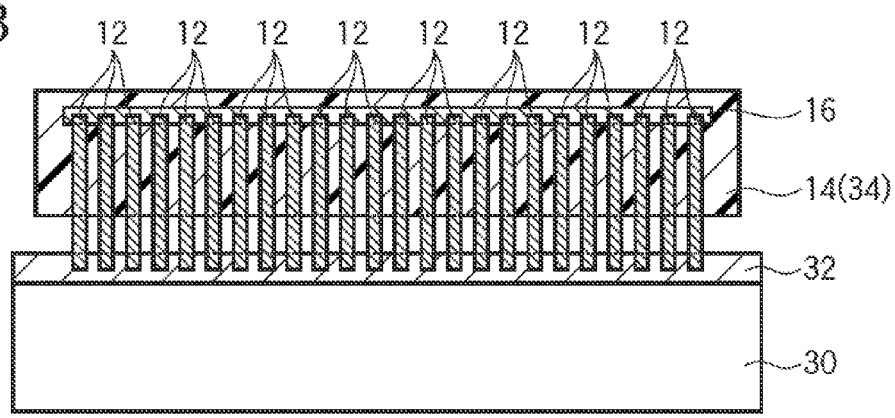
Figure 5C:
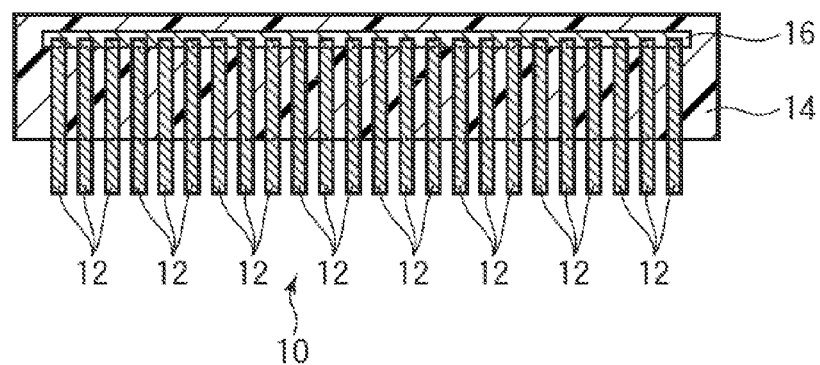
Figure 6:
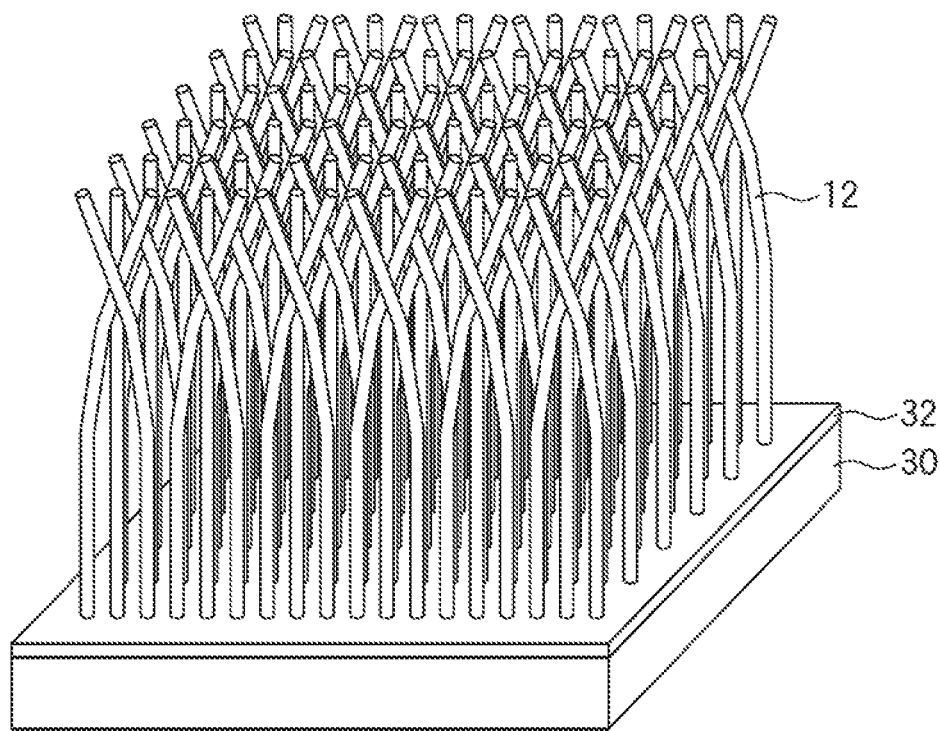
FIG. 6 is a perspective view illustrating the method of manufacturing the carbon nanotube sheet according to the second embodiment.
Figure 7:
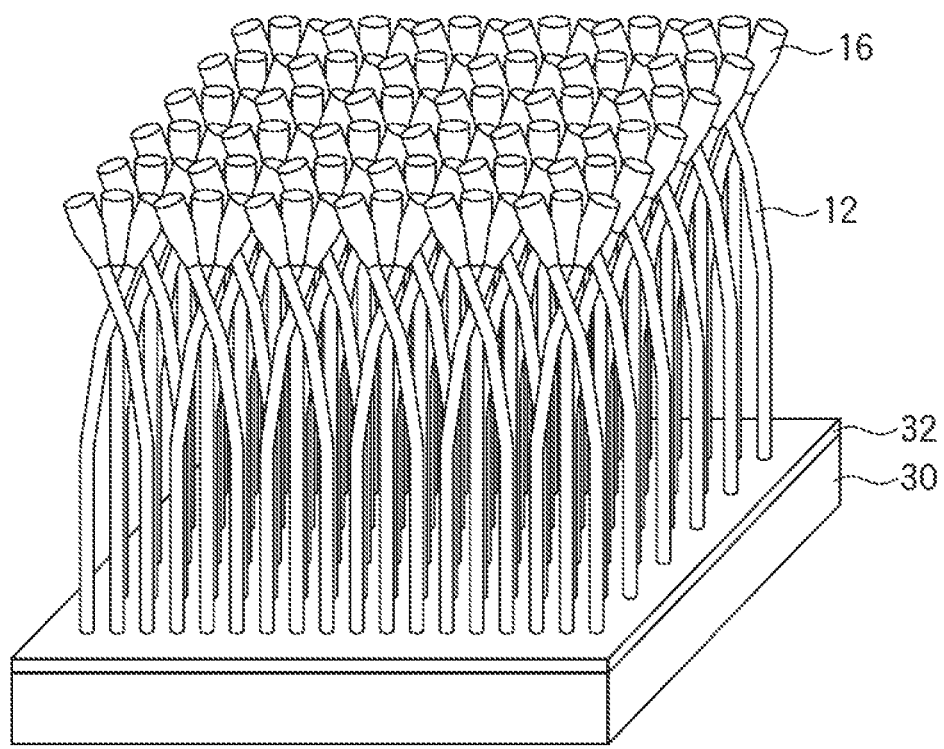
FIG. 7 is a perspective view illustrating the method of manufacturing the carbon nanotube sheet according to the second embodiment.
Figure 8:
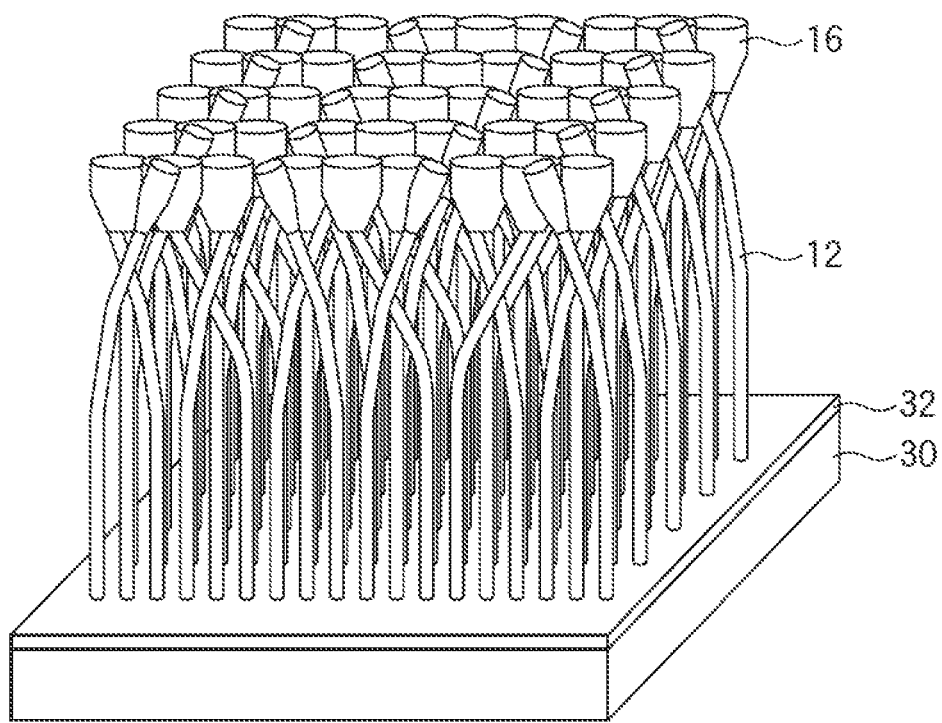
FIG. 8 is a perspective view illustrating the method of manufacturing the carbon nanotube sheet according to the second embodiment.

FIG. 4 is a diagrammatic sectional view illustrating a structure of a carbon nanotube sheet according to the present embodiment. FIGS. 5A-5C are sectional views illustrating a method of manufacturing the carbon nanotube sheet according to the present embodiment. FIGS. 6-8 are perspective views illustrating the method of manufacturing the carbon nanotube sheet according to the present embodiment.

First, the structure of the carbon nanotube sheet according to the present embodiment will be explained with reference to FIG. 4.

As illustrated in FIG. 4, the carbon nanotube sheet 10 according to the present embodiment is the same as the carbon nanotube sheet 10 according to the fist embodiment illustrated in FIG. 1 except that in the present embodiment, a coating film 16 is formed on one ends of the carbon nanotubes 12.

The material forming the coating film 16 is not specifically limited as far as the material has a higher thermal conductivity than the constituent material of the filling layer 14. For the carbon nanotube sheet 10 for electric conduction use, electrically conductive materials, e.g., metal, alloys, etc. can be used. As the constituent material of the coating film 16, copper (Cu), nickel (Ni), gold (Au), etc., for example, can be used. The coating film 16 may not have essentially a single layer structure and may have multilayer structures of two layers or three or more layers, such as the layer structure of titanium (Ti) and gold (Au), etc.

The thickness of the coating film 16 is not specifically limited as far as the coating film does not hinder the penetration of the thermoplastic resin film 34 in the manufacturing process. Preferably, the film thickness of the coating film is suitably determined depending on the permeability of the thermoplastic resin film 34, required characteristics of the carbon nanotube sheet 10, the constituent material of the coating film 16, etc.

The coating film 16 of high thermal conductivity is provided, whereby the contact area of the carbon nanotube sheet 10 to a mounted body (a heat radiator, a heat generator) can be increased in comparison with the case where the coating film 16 is not provided. This decreases the thermal contact resistance between the carbon nanotubes 12 and the mounted body, and the thermal conductivity of the carbon nanotube sheet 10 can be increased. When the carbon nanotube sheet 10 is used as an electrically conductive sheet, the electric conductivity can be increased.

In FIG. 4, the coating film 16 is formed on one ends of the carbon nanotubes 12 of the carbon nanotube sheet 10 illustrated in FIG. 1A. Also on the other ends of the carbon nanotubes 12, the coating film 16 may be formed. The coating film 16 may be formed on one ends or on both ends of the carbon nanotubes 12 of the carbon nanotube sheet illustrated in FIG. 1B.

Next, the method of manufacturing the carbon nanotube sheet according to the present embodiment will be explained with reference to FIGS. 5A to 8.

First, in the same way as in, e.g., the method of manufacturing the carbon nanotube sheet according to the first embodiment illustrated in FIGS. 2A to 2C, the carbon nanotubes 12 are grown over the substrate 30.

In FIGS. 1 to 5, the carbon nanotubes 12 are illustrated in simple cylindrical shapes so as to simplify the drawings, but the carbon nanotubes are not always grown in perfect cylindrical shapes due to dispersions, etc. of the early growth. The carbon nanotubes 12 are oriented generally film-thicknesswise, but as illustrated in FIG. 6, the upper end of the carbon nanotubes 12 may tilt from the normal of the substrate 30, and the length of the carbon nanotubes 12 may be disuniform.

Then, over the carbon nanotubes 12, an about 300 nm-thickness Au (gold) film is deposited by, e.g., evaporation method to form the coating film 16 of Au (FIG. 5A). The coating film 16 may be formed by another film forming method (e.g., sputtering method or others) unless the method damages the carbon nanotubes 12.

The material forming the coating film 16 is not specifically limited as far as the material has a higher thermal conductivity than a constituent material of the filling layer 14. When the carbon nanotube sheet 10 is used for electric conduction, electrically conductive materials, e.g., metal, alloys, etc. can be used. As the constituent material of the coating film 16, copper (Cu), nickel (Ni), gold (Au), etc., for example, can be used. The coating film 16 may not have essentially a single layer structure and may have multilayer structures of two layers or three or more layers, such as the layer structure of titanium (Ti) and gold (Au), etc.

As exemplified in FIG. 7, the coating film is formed, covering the forward ends of the respective carbon nanotubes 12 in the early stage of the growth. As the grown film thickness increases, the coating film 16 formed on the forward ends of the respective carbon nanotubes 12 adjacent to each other is jointed. Thus, as exemplified in FIG. 8, the coating film 16 is formed, bundling the forward ends of plural one of the carbon nanotubes 12. As the grown film thickness of the coating film 16 increases, the coating film 16 is completely jointed in the two-dimensional direction parallel with the surface of the sheet, and the coating film 16 becomes a unified film without gaps.

It is preferable that the film thickness of the coating film 16 is suitably set corresponding to a diameter and a density of the carbon nanotubes in consideration of the permeability of the thermoplastic resin film 34 for forming the filling layer 14, etc.

For example, when the diameter of the carbon nanotubes 12 is 10 nm, and the surface density is $1 \times 10^{11}$ cm$^2$, the gap between the carbon nanotubes 12 adjacent to each other is about 50 nm. In this case, to joint the carbon nanotubes 12 adjacent to each other by the coating film 16, the coating film 16 is formed in a film thickness of at least above a half or more of the gap, i.e., the coating film is preferably formed in an about 25 nm or more film thickness. When the coating film 16 is too thick, the coating film becomes a perfect film without gaps, which lowers the permeability of the thermoplastic resin film 34. Preferably, the upper limit of the film thickness of the coating film 16 is set in terms of the permeability of the thermoplastic resin film 34. In view of this, for the carbon nanotubes 12 of the above-conditions, the film thickness of the coating film 16 is set preferably at about 25-1000 nm.

Next, in the same way as in, e.g., the method of manufacturing the carbon nanotube sheet according to the first embodiment illustrated in FIGS. 3A and 3B, the thermoplastic resin film 34 is penetrated in the gaps of the carbon nanotubes 12, and the filling layer 14 is formed (FIG. 5B).

The coating film 16 may not be essentially formed in a film thickness sufficient to joint the carbon nanotubes 12 adjacent to each other but has the effect of bundling plural ones of the carbon nanotubes 12 (see FIG. 8). Thus, when the thermoplastic resin film 34 is penetrated into the gaps between the carbon nanotubes 12, the carbon nanotubes 12 are hindered from separating from each other. Also, the heat can be caused to conduct transversely.

Then, the carbon nanotubes 12, the coating film 16 and the filling layer 14 are peeled from the substrate 30, and the carbon nanotube sheet according to the present embodiment is obtained (FIG. 5C).

Then, as required, the same coating film (not illustrated) as the coating film 16 is formed on the ends of the carbon nanotubes 12 from which the substrate 30 has been peeled.

As described above, according to the present embodiment, a thermoplastic resin is used as the material of the filling layer supporting the carbon nanotubes, whereby the carbon nanotube sheet having the filling layer which can reflow and having small thermal contact resistance can be easily formed. The penetration quantity of the filling material can be easily controlled by the heat processing temperature and the heat processing period of time. Thus, the ends of the carbon nanotubes can be easily exposed. Also, the sheet can be easily peeled from the substrate. The coating film of a material whose thermal conductivity is higher than the filling layer is formed on the ends of the carbon nanotubes, whereby the thermal contact resistance to a mounted body can be drastically lowered.

[A Third Embodiment]

The carbon nanotube sheet and the method of manufacturing the carbon nanotube sheet according to a third embodiment will be explained with reference to FIGS. 9 to 14. The same members of the present embodiment as those of the carbon nanotube sheet and the method of manufacturing the carbon nanotube sheet according to the first and the second embodiments illustrated in FIGS. 1A to 8 are represented by the same reference numbers not to repeat or to simplify their explanation.

Figure 9A:
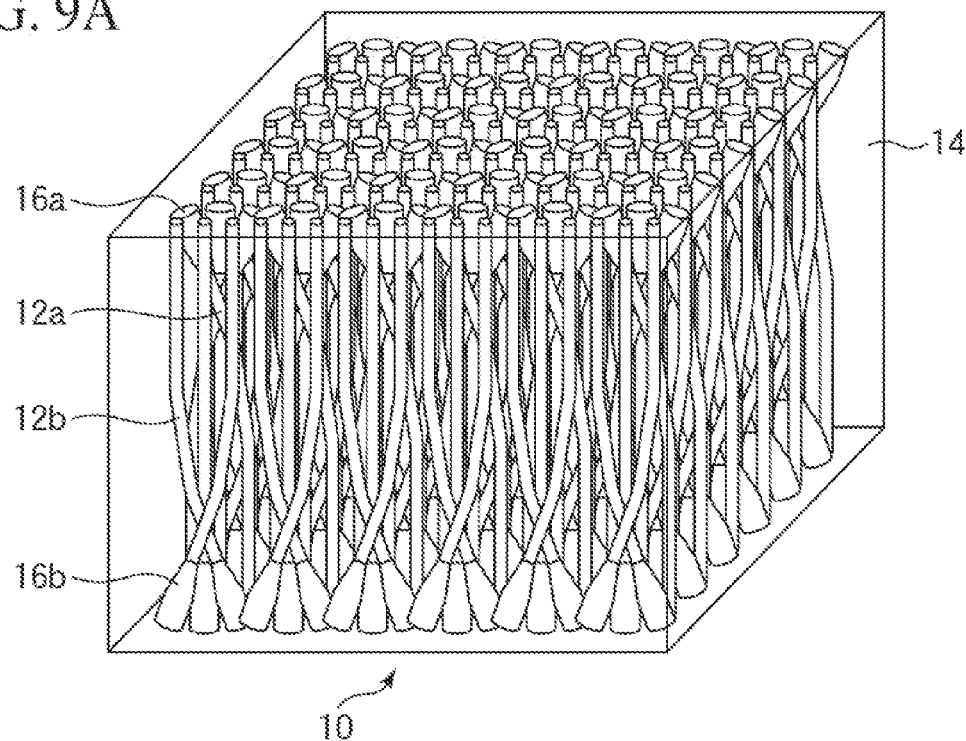
FIGS. 9A and 9B are perspective views illustrating structures of a carbon nanotube sheet according to a third embodiment.
Figure 9B:
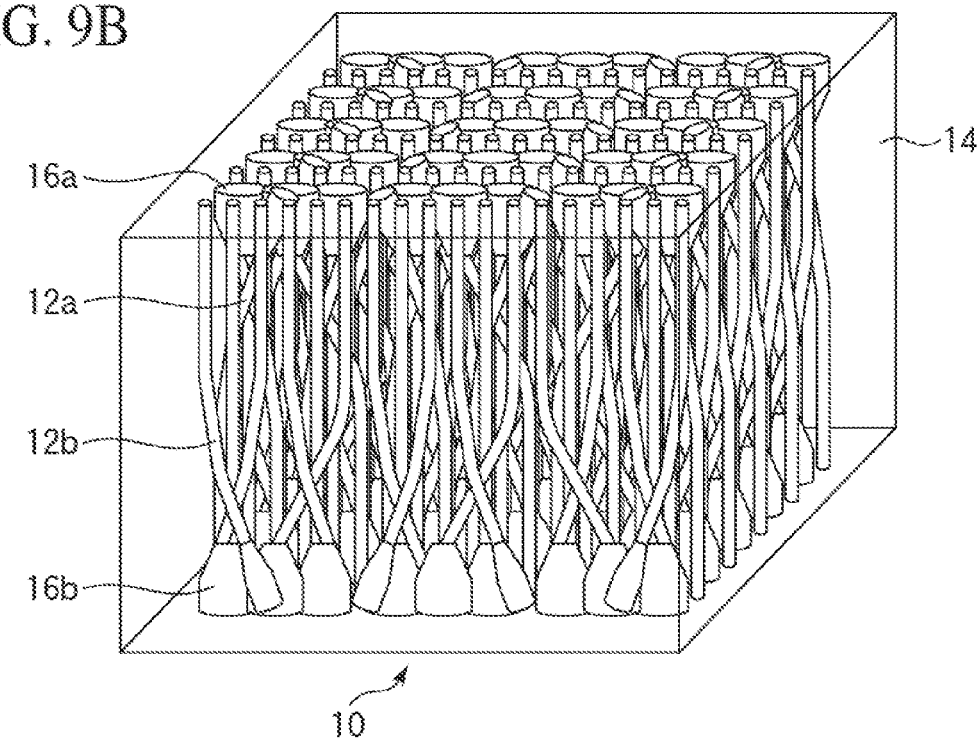

FIGS. 9A and 9B are perspective views illustrating structures of a carbon nanotube sheet according to the present embodiment. FIGS. 10A-13 are perspective views illustrating a method of manufacturing the carbon nanotube sheet according to the present embodiment. FIG. 14 is a perspective view illustrating a method of manufacturing the carbon nanotube sheet according to another example of the present embodiment.

First, the structure of the carbon nanotube sheet according to the present embodiment will be explained with reference to FIGS. 9A and 9B. FIG. 9A illustrates a first example of the carbon nanotube sheet according to the present embodiment, and FIG. 9B illustrates a second example of the carbon nanotube sheet according to the present embodiment.

The carbon nanotube sheet 10 according to the present embodiment is the same as the carbon nanotube sheet according to the first and the second embodiments in that, as illustrated in FIG. 9A and FIG. 9B, a plurality of carbon nanotubes 12 are spaced from each other, and the filling layer 14 of a thermoplastic resin is buried in the gaps.

The carbon nanotube sheet 10 according to the present embodiment includes a plurality of carbon nanotubes 12a and a plurality of carbon nanotubes 12b. The plural carbon nanotubes 12a have a coating film 16a on the ends thereof which are on the side of one surface of the carbon nanotube sheet 10 (upper surface as viewed in the drawing). On the other hand, the plural carbon nanotubes 12b have a coating film 16b on the ends thereof which are on the side of the other surface of the carbon nanotube sheet 10 (lower surface as viewed in the drawing).

The carbon nanotube sheet 10 of the first example illustrated in FIG. 9A and the carbon nanotube sheet 10 of the second example illustrated in FIG. 9B are different from each other in the thickness of the coating films 16a, 16b. That is, in the carbon nanotube sheet 10 of the first example illustrated in FIG. 9A, as has been explained with reference to FIG. 7, the coating films 16a, 16b are formed, respectively covering the ends of the carbon nanotubes 12a and the ends of the carbon nanotubes 12b. In the carbon nanotube sheet 10 of the second example illustrated in FIG. 9B, as has been explained with reference to FIG. 8, the coating films 16a, 16b are respectively formed, bundling the ends of plural ones of the carbon nanotubes 12a and the ends of plural ones of the carbon nanotubes 12b.

The constituent materials of the filling material 14 and the coating film 16 are the same as those of the carbon nanotube sheet according to the first or the second embodiment.

Next, the method of manufacturing the carbon nanotube sheet according to the present embodiment will be explained with reference to FIGS. 10A to 13. The method of manufacturing the carbon nanotube sheet of the second example illustrated in FIG. 9B will be explained here, but the method of manufacturing the carbon nanotube sheet of the first example illustrated in FIG. 9A is the same as the method of manufacturing the carbon nanotube sheet of the second example except that the thickness of the coating film 16 is different.

Figure 10A:
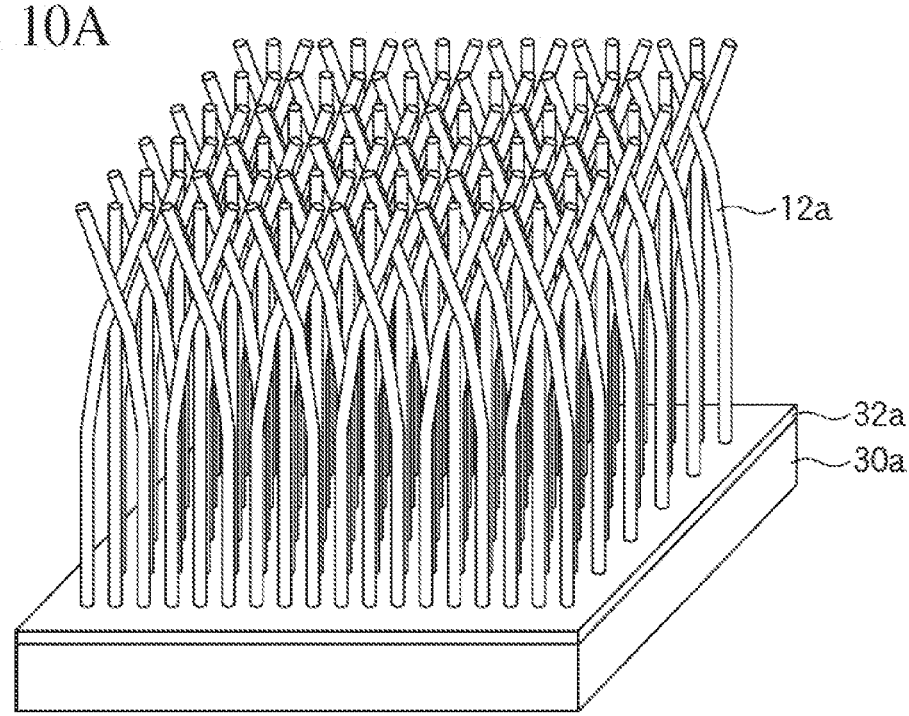
FIGS. 10A-10B are perspective views illustrating a method of manufacturing the carbon nanotube sheet according to the third embodiment.

First, in the same way of in, e.g., the method of manufacturing the carbon nanotube sheet according to the first embodiment illustrated in FIGS. 2A to 2C, a plurality of carbon nanotubes 12a are grown over the substrate 30a (FIG. 10A).

Figure 10B:
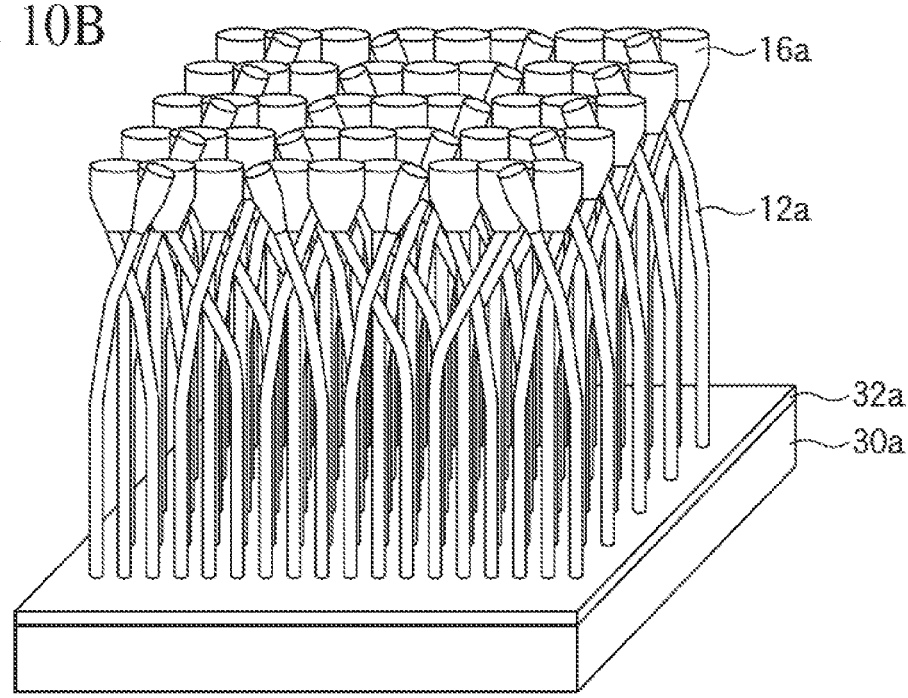

Next, in the same way as in, e.g., the method of manufacturing the carbon nanotube sheet according to the second embodiment illustrated in FIG. 5A, the coating film 16a is formed on the carbon nanotubes 12a (FIG. 10B).

Figure 11A:
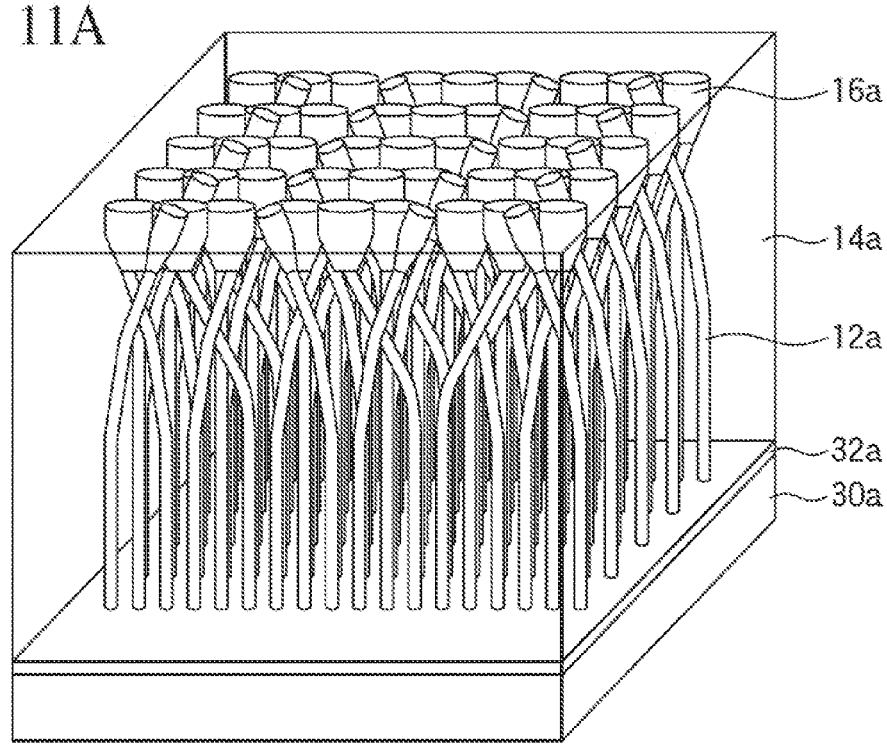
FIGS. 11A-11B are perspective views illustrating a method of manufacturing the carbon nanotube sheet according to the third embodiment.

Next, in the same way as in, e.g., the method of manufacturing the carbon nanotube sheet according to the second embodiment illustrated in FIG. 5B, the thermoplastic resin film 34 is penetrated between the carbon nanotubes 12a to form the filling layer 14a of the thermoplastic resin material (FIG. 11A). In FIG. 11A, the thermoplastic resin film 34 (the filling layer 14) is penetrated down to the substrate 30, but, as in the first and the second embodiments, it may be penetrated to the extent that the thermoplastic resin film 34 does not arrive at the substrate 30a.

Figure 11B:
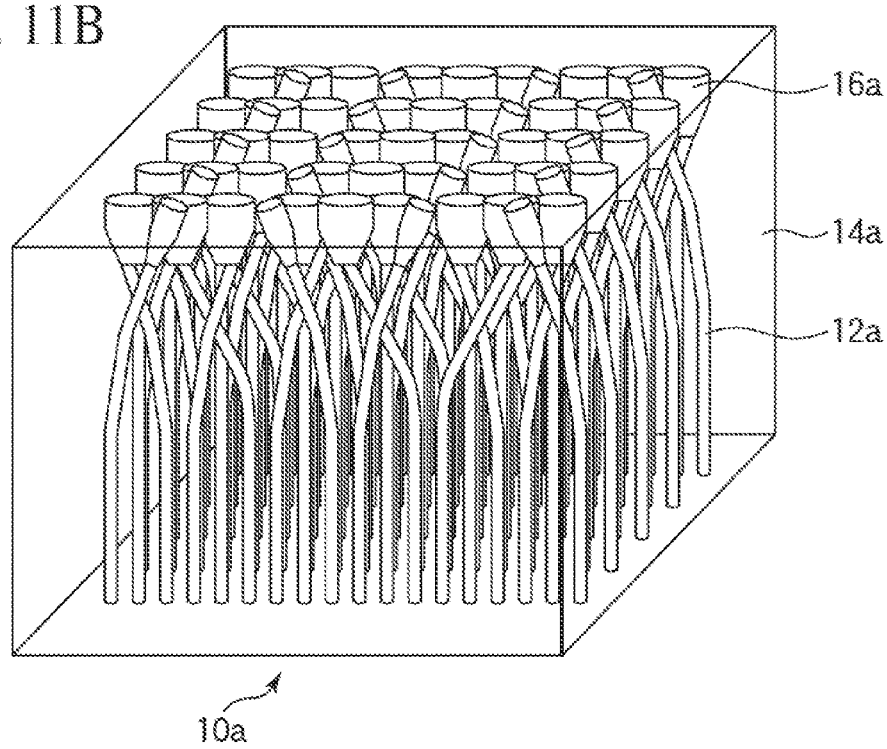

Then, the carbon nanotubes 12a with the coating film 16a formed on, and the filling layer 14a are peeled from the substrate 30a, and the carbon nanotube sheet 10a is formed (FIG. 11B). The carbon nanotube sheet 10a is the same as the carbon nanotube sheet 10 according to the second embodiment.

By the above-described procedures, in addition to the carbon nanotube sheet 10a, the carbon nanotube sheet 10b including the carbon nanotubes 12b with the coating film 16b formed on buried in the filling layer 14b is prepared.

Figure 12:
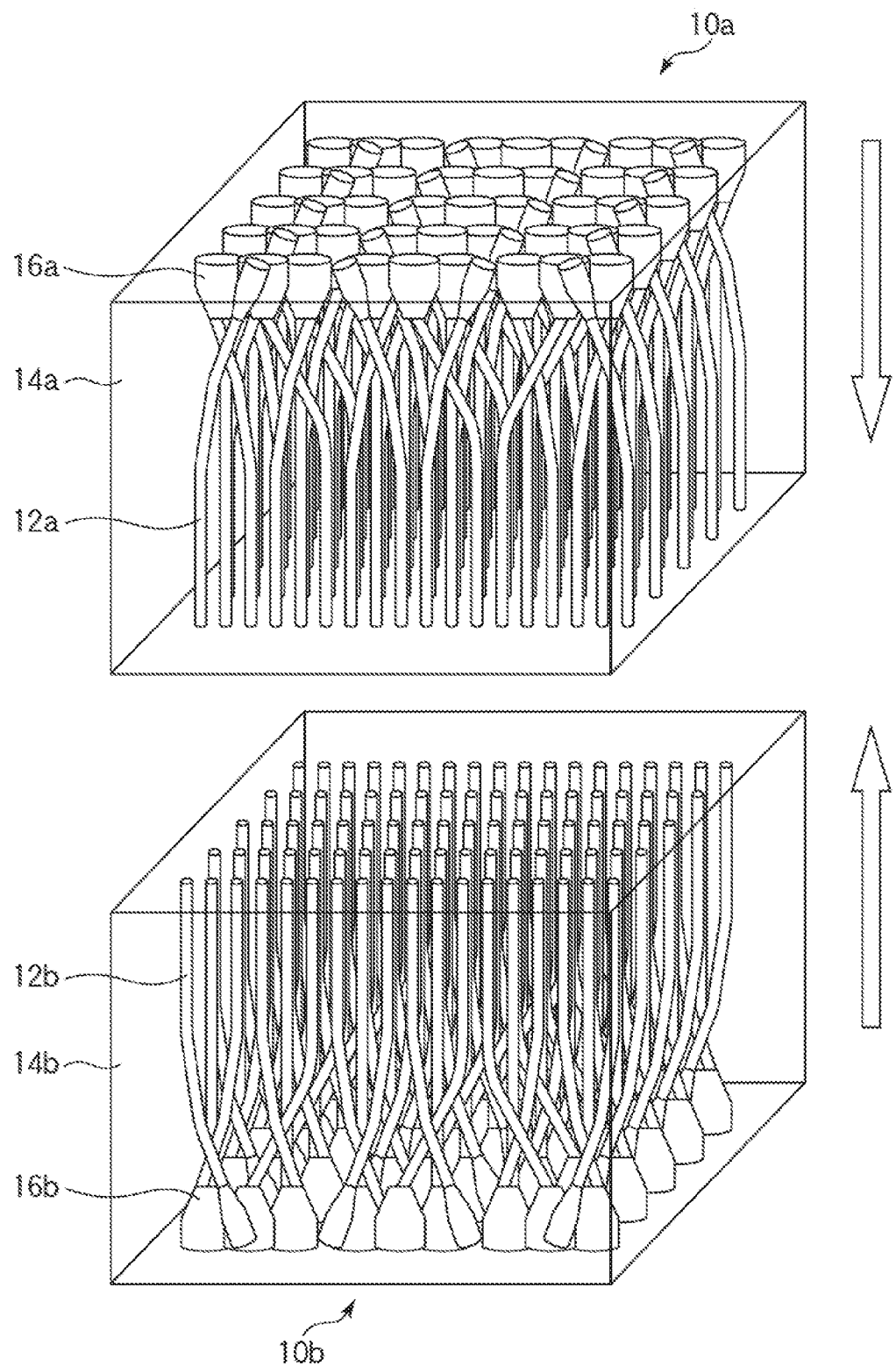
FIG. 12 is a perspective view illustrating a method of manufacturing the carbon nanotube sheet according to the third embodiment.

Next, the carbon nanotube sheet 10a and the carbon nanotube sheet 10b are laid on each other with the surfaces thereof where the coating films 16a, 16b are not formed (FIG. 12).

Then, the layer body of the carbon nanotube sheet 10a and the carbon nanotube sheet 10b is heated under load. For example, when "Micromelt 6239" from Henkel Japan Ltd. is used for the thermoplastic resin forming the filling layers 14a, 14b, the layer body is heated at 195° C. under a 10 N/cm$^2$ pressure. Thus, the filling layer 14a, 14b are melted and liquefied to be unified, the carbon nanotubes 12a are inserted in the gaps between the carbon nanotubes 12b, and the carbon nanotubes 12b are inserted in the gaps between the carbon nanotubes 12a.

Next, the layer body is cooled to room temperature to set the filling layers 14a, 14b (hereinafter called the filling layer 14).

Figure 13:
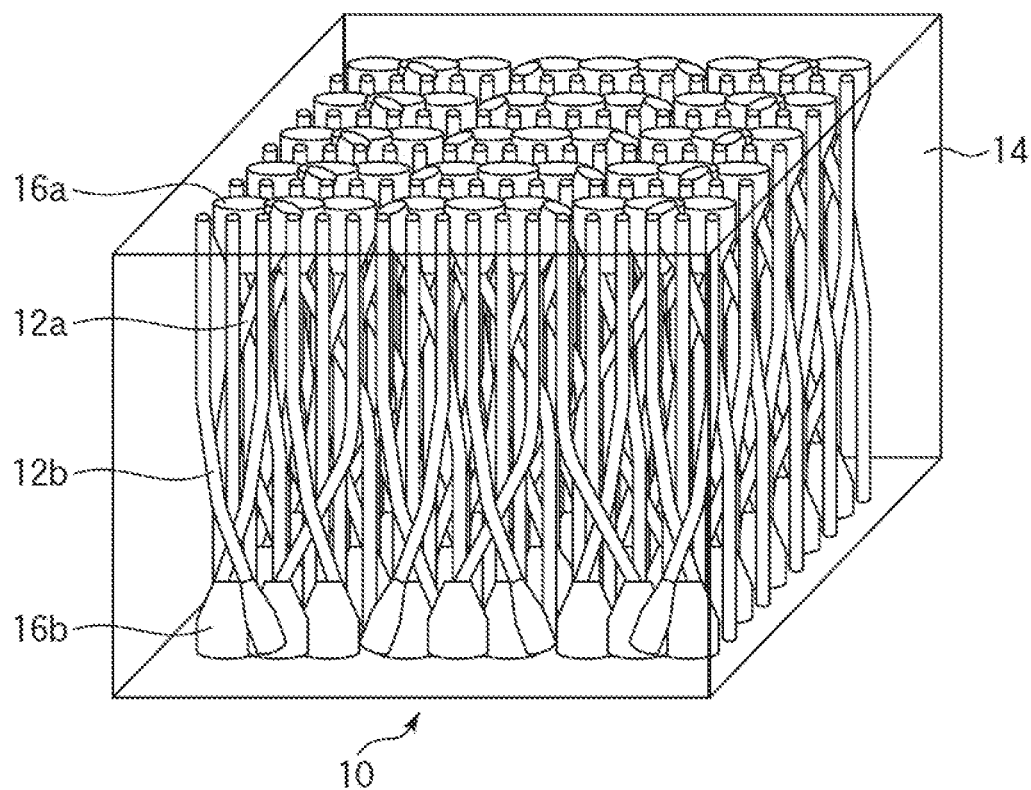
FIG. 13 is a perspective view illustrating a method of manufacturing the carbon nanotube sheet according to the third embodiment.
Figure 14:
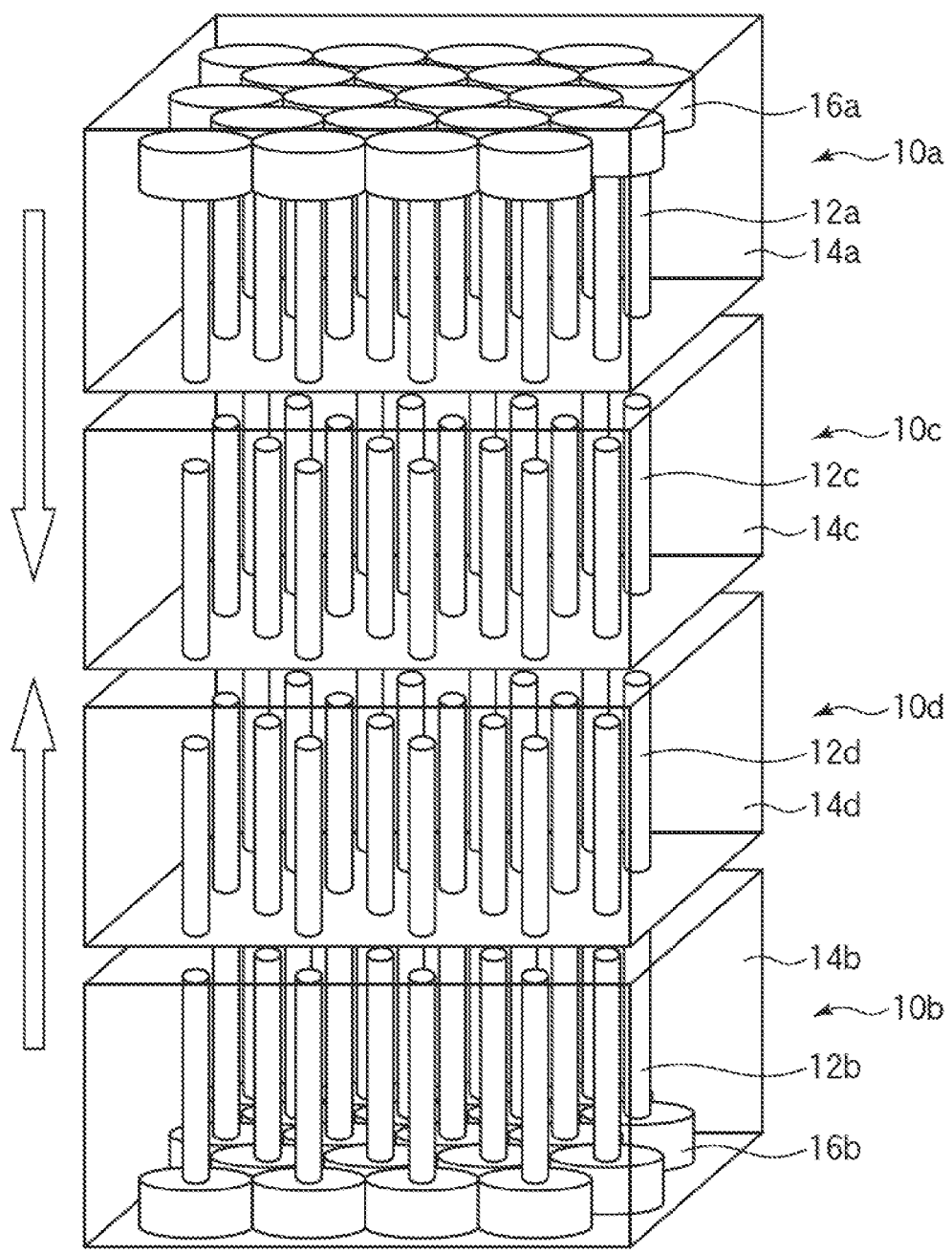
FIG. 14 is a perspective view illustrating a method of manufacturing the carbon nanotube sheet according to another example of the third embodiment.

Thus, the carbon nanotube sheet 10 having the carbon nanotubes 12a with the coating film 16a formed on, and the carbon nanotubes 12b with the coating film 16b formed on buried in the filling layer 14 is formed (FIG. 13).

The surface density of the carbon nanotubes 12a, 12b varies depending on growth conditions of the carbon nanotubes. For example, even when the carbon nanotubes 12 are formed in a surface density of about $1 \times 10^{12}$ cm$^{-2}$, the surface density of the carbon nanotubes 12 can be doubled by the method of manufacturing the carbon nanotube sheet according to the present embodiment. Thus, the thermal conductivity and the heat radiation efficiency of the carbon nanotube sheet can be drastically improved.

More sheets of the carbon nanotube sheet are laid on, whereby the surface density of the carbon nanotubes can be further increased.

For example, as illustrated in FIG. 14, between the carbon nanotube sheets 10a, 10b described above, a carbon nanotube sheet 10c with the carbon nanotubes 12c buried in the filling layer 14c, and the carbon nanotube sheet 10d with the carbon nanotubes 12d buried in the filling layer 14d may be sandwiched. Thus, the surface density of the carbon nanotubes can be made four times. The number of the carbon nanotube sheets to be laid on can be suitably set corresponding to a required thermal conductivity and heat radiation efficiency.

When three or more of the carbon nanotube sheet are laid on, all the sheets may not be unified at once. For example, in the example of FIG. 14, the carbon nanotube sheet 10a and the carbon nanotube sheet 10c, and the carbon nanotube sheet 10b and the carbon nanotube sheet 10d are respectively unified, and then the two unified sheets can be unified. Otherwise, it is possible to unify the carbon nanotube sheet 10a and the carbon nanotube sheet 10c, then unify the carbon nanotube sheet 10d therewith, and furthermore, unify the carbon nanotube sheet 10b therewith.

The carbon nanotube sheets 10c, 10d may not have the coating film on the ends so as to facilitate the insertion of the carbon nanotubes 12c, 12d in the gaps between the carbon nanotubes of the other sheets. The carbon nanotube sheets 10c, 10d can be manufactured by the same procedures as those of, e.g., the method of manufacturing the carbon nanotube sheet according to the first embodiment.

As described above, according to the present embodiment, a plurality of carbon nanotube sheet having the filling layer supporting the carbon nanotubes formed of a thermoplastic resin are laid on and are unified by thermal processing, whereby the surface density of the carbon nanotubes can be drastically improved. Thus, the thermal conductivity of the sheet can be drastically improved.

[A Fourth Embodiment]

The carbon nanotube sheet and the method of manufacturing the carbon nanotube sheet according to a fourth embodiment will be explained with reference to FIG. 15A to FIG. 19. The same members of the present embodiment as those of the carbon nanotube sheet and the method of manufacturing the carbon nanotube sheet according to the first to the third embodiments illustrated in FIGS. 1A to 14 are represented by the same reference numbers not to repeat or to simplify their explanation.

FIGS. 15A and 15B are perspective views illustrating structures of a carbon nanotube sheet according to the present embodiment. FIGS. 16A-16B, 17A-17B, 18A-18B and 19 are perspective views illustrating a method of manufacturing the carbon nanotube sheet according to the present embodiment.

First, the structure of the carbon nanotube sheet according to the present embodiment will be explained with reference to FIGS. 15A and 15B. FIG. 15A illustrates a first example of the carbon nanotube sheet according to the present embodiment, and FIG. 15B illustrates a second example of the carbon nanotube sheet according to the present embodiment.

As illustrated in FIG. 15A and FIG. 15B, the carbon nanotube sheet 10 according to the present embodiment is the same as the carbon nanotube sheet according to the first to the third embodiments in that a plurality of carbon nanotubes 12 are spaced from each other, and the filling layer 14 of a thermoplastic resin is buried in the gaps.

In the carbon nanotube sheet 10 according to the present embodiment, the filling layer 14 is formed of the layer body of the filling layers 14A, 14B and 14C. The coating films 16 are formed on both ends of the carbon nanotubes 12.

The filling layers 14A, 14C are formed of the same thermoplastic resin as the thermoplastic resin forming the filling layer 14 of the carbon nanotube sheet according to the first to the third embodiments. The constituent material of the coating film 16 is the same as the coating film 16 of the carbon nanotube sheet according to the first to the third embodiments.

The material of the filling layer 14B is not especially limited as long as the material exhibits the liquid properties when burying the carbon nanotubes 12. For example, as the organic filling material, acryl resin, epoxy resin, silicone resin, polyimide resin, etc. can be used. As the inorganic filling material, compositions for the spin on insulating film, e.g., SOG (Spin On Glass) can be used. Metal materials, such as indium, solder, metal paste (e.g., silver paste), etc. can be also used. Electrically conductive polymers, e.g., polyaniline, polyolefine, etc. can be also used.

In the filling layer 14B, additives may be mixed dispersed as required. As the additives, for example, substances of high thermal conductivity and substances of high electric conductivity may be considered. Additives of high thermal conductivity are mixed dispersed in the filling layer 14B portion, whereby the thermal conductivity of the filling layer 14B portion can be improved, and the thermal conductivity of the carbon nanotube sheet 10 as a whole can be improved. When the carbon nanotube sheet is used as an electric conductive sheet, an additive of high electric conductivity is mixed dispersed in the filling layer 14B portion, whereby the electric conductivity of the carbon nanotube sheet 10 as a whole can be improved. As material of high thermal conductivity, carbon nanotubes, metal material, aluminum nitride, silica, alumina, graphite, fullerene, etc. can be used. As materials of high electric conductivity, carbon nanotubes, metal materials, etc. can be used.

The filling layer 14 is formed of a material of high thermal conductivity, whereby the thermal conductivity of the sheet as a whole can be improved. However, the thermal conductivity of the thermoplastic resin is ordinarily not more than 0.1 [W/m·K], and the whole filling layer 14 formed of the thermoplastic resin does not substantially contribute to the heat conduction. The filling layer 14B is formed of a material of some high thermal conductivity, e.g., a electrically conductive polymer in place of the thermoplastic resin, and the filling layers 14A, 14C are formed of the thermoplastic resin in consideration of the adhesion and the interface heat resistance in operation, whereby the thermal conductivity of the sheet as a whole can be improved.

The carbon nanotube sheet of the first example illustrated in FIG. 15A and the carbon nanotube sheet 10 of the second example illustrated in FIG. 15B are different from each other in the thickness of the coating films 16. That is, in the carbon nanotube sheet 10 of the first example illustrated in FIG. 15A, as has been explained with reference to FIG. 7, the coating film 16 is formed, covering the forward ends of the respective carbon nanotubes 12. In the carbon nanotube sheet 10 of the second example illustrated in FIG. 15B, as has been explained with reference to FIG. 8, the coating film 16 is formed, bundling the forward ends of plural ones of the carbon nanotubes 12.

Then, the method of manufacturing the carbon nanotube sheet according to the present embodiment will be explained with reference to FIGS. 16A to 19. The method of manufacturing the carbon nanotube sheet of the second example illustrated in FIG. 15B will be explained here, but the method of manufacturing the carbon nanotube sheet of the first example illustrated in FIG. 15A is the same as the method of manufacturing the carbon nanotube sheet of the second example except that the thickness of the coating film 16 is different.

Figure 16A:
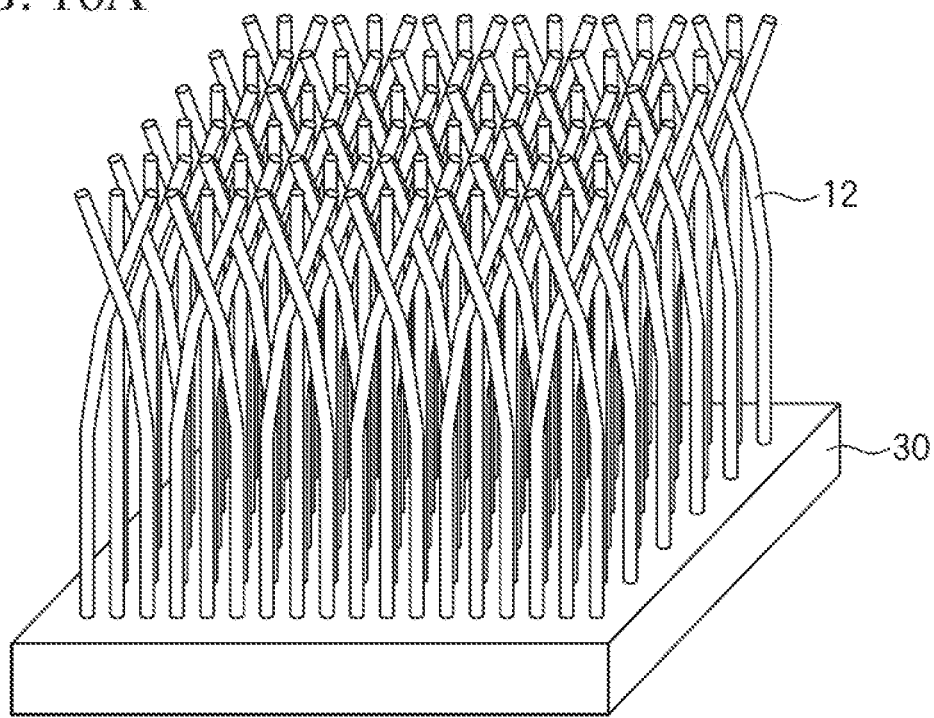

First, in the same way as in, e.g., the method of manufacturing the carbon nanotube sheet according to the first embodiment illustrated in FIGS. 2A to 2C, a plurality of carbon nanotubes 12 are formed over the substrate 30 (FIG. 16A).

Figure 16B:
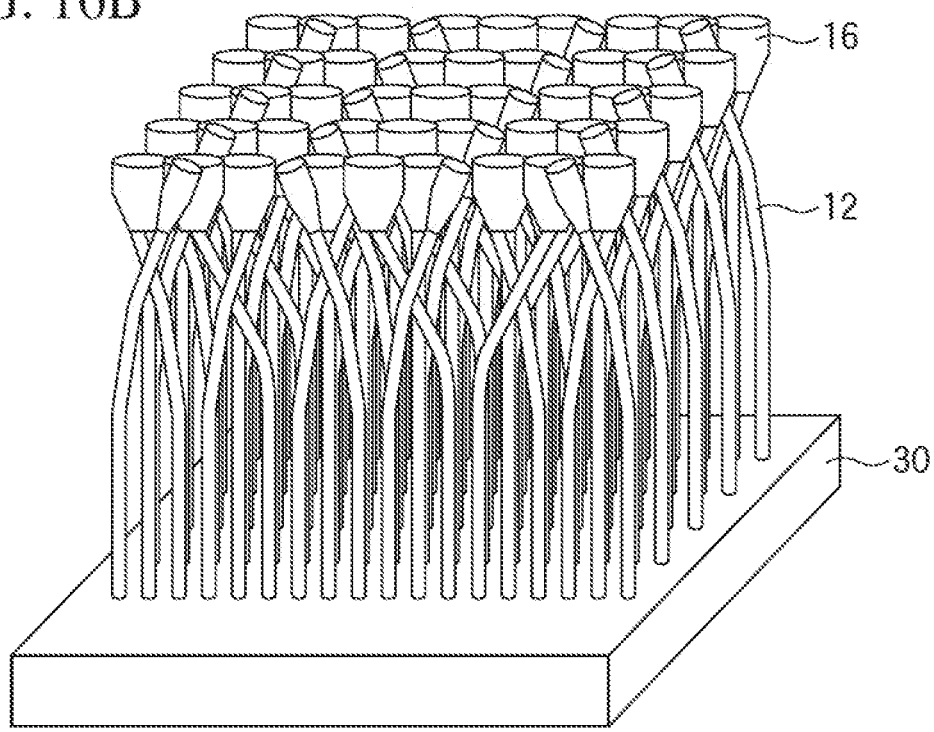

Next, in the same way as in, e.g., the method of manufacturing the carbon nanotube sheet according to the second embodiment illustrated in FIG. 5A, the coating film 16 is formed on one ends of the carbon nanotubes 12 (FIG. 16B).

Next, in addition to the substrate 30, another substrate 40 is prepared.

Then, a photoresist film of a 6 µm-thickness, for example, is applied to the substrate 40 by, e.g., spin coating method. The substrate 40 is not especially limited but can be, e.g., a sapphire substrate or others. In place of the photoresist film 42, films of other materials which are etching selective to the filling layer 14B can be formed.

Then, over the surface of the substrate 40 the photoresist film 42 has been applied to, the substrate 30 is mounted with the surfaces of the carbon nanotubes 12 the coating film 16 is formed on opposed thereto, and the photoresist film 42 is set. Thus, the ends of the carbon nanotubes 12 covered by the coating film 16 are covered by the photoresist film 42.

Figure 17A:
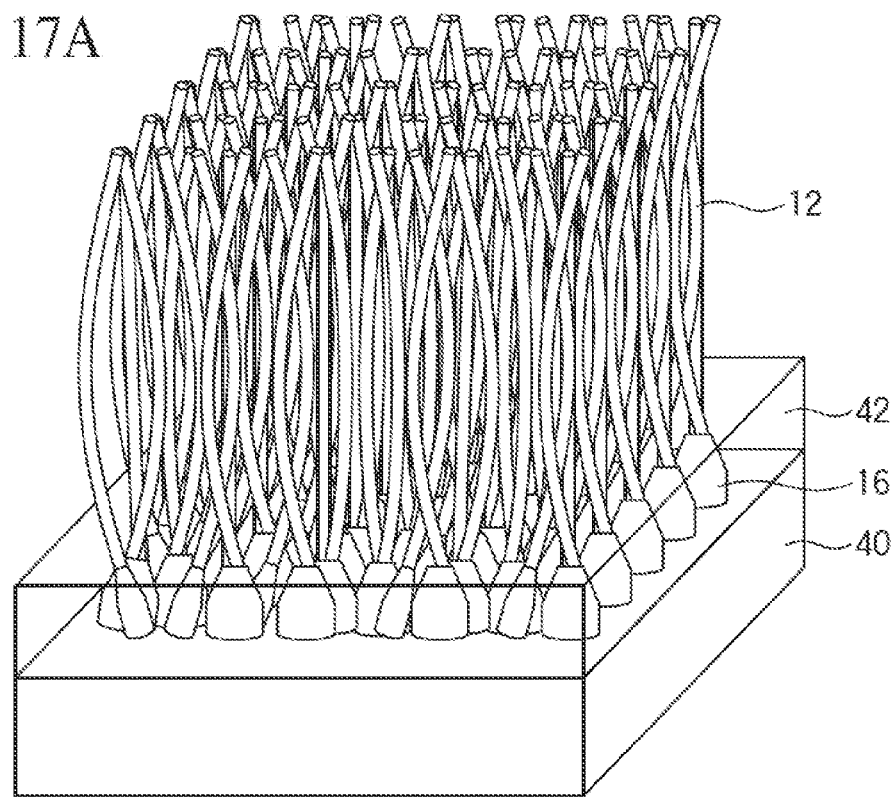

Then, the substrate 30 is peeled from the carbon nanotubes 12. Thus, the carbon nanotubes 12 with the coating film 16 formed on are transferred to the substrate 40 (FIG. 17A).

Figure 17B:
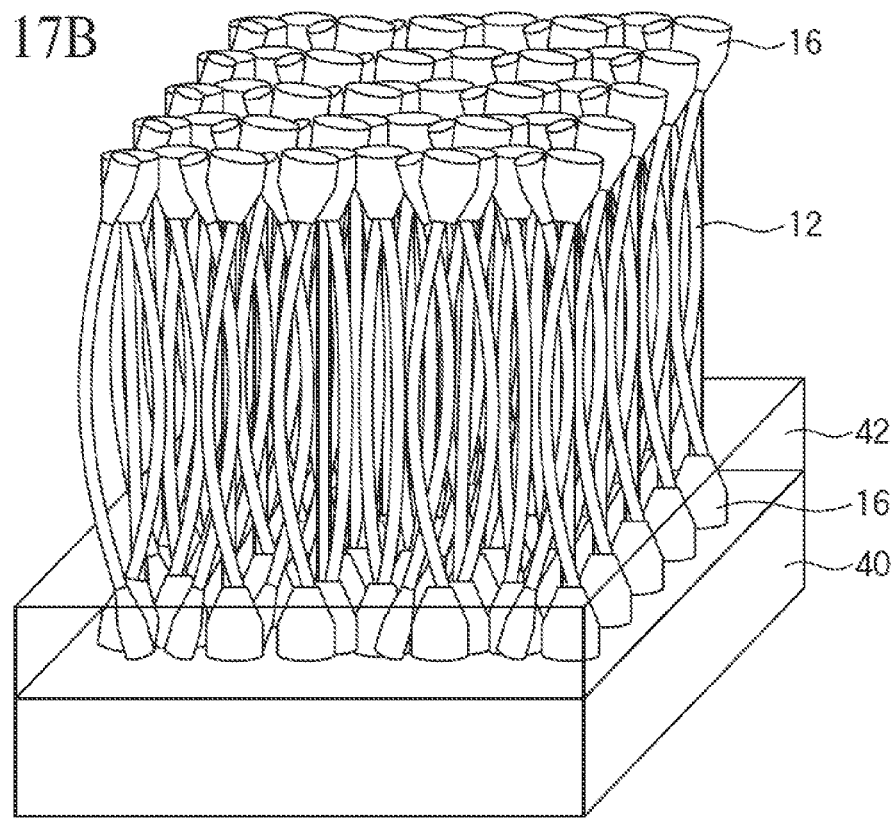

Then, in the same way as in, e.g., the method of manufacturing the carbon nanotube sheet according to the second embodiment illustrated in FIG. 5A, the coating film 16 is formed on the other ends of the carbon nanotubes 12 (FIG. 17B).

Next, by, e.g., spin coating method, a filling material to be the filling layer 14B is applied. At this time, the viscosity of the coating solution and the rotation number of the spin coater are suitably set so that the thickness of the filling material on the coating film 16 becomes not more than tens nm.

The filling material to be the filling layer 14B is not especially limited as far as the filling material can be set thereafter. For example, as organic filling materials, acryl resin, epoxy resin, silicone resin, polyimide resin, etc. can be used. As inorganic filling materials, compositions for forming spin on insulating film, such as SOG (Spin On Glass), etc., can be used. Also metal materials, such as indium, solder, metal paste (e.g., silver paste), etc., can be used. Electrically conductive polymers, e.g., polyaniline, polyolefine, etc. can be used. As the filling material to be the filling layer 14B, a silicone-based resin is used here.

Next, the filling material is set by thermal processing, UV radiation or others, and the filling layer 14B is formed (FIG. 18A).

Then, the photoresist film 42 is selectively removed by, e.g., an organic solvent to peel from the substrate 40 the carbon nanotubes 12 buried in the filling layer 14B and having the coating film 16 formed on the ends (FIG. 18B). At this time, one ends of the carbon nanotubes 12 which have been covered by the photoresist film 42 are not covered by the filling layer 14B.

Next, in the same way as in, e.g., the method of manufacturing the carbon nanotube sheet according to the second embodiment illustrated in FIG. 5B, the filling layers 14A, 14C of a thermoplastic resin material are formed on both surfaces of the filling layer 14B.

Figure 19:
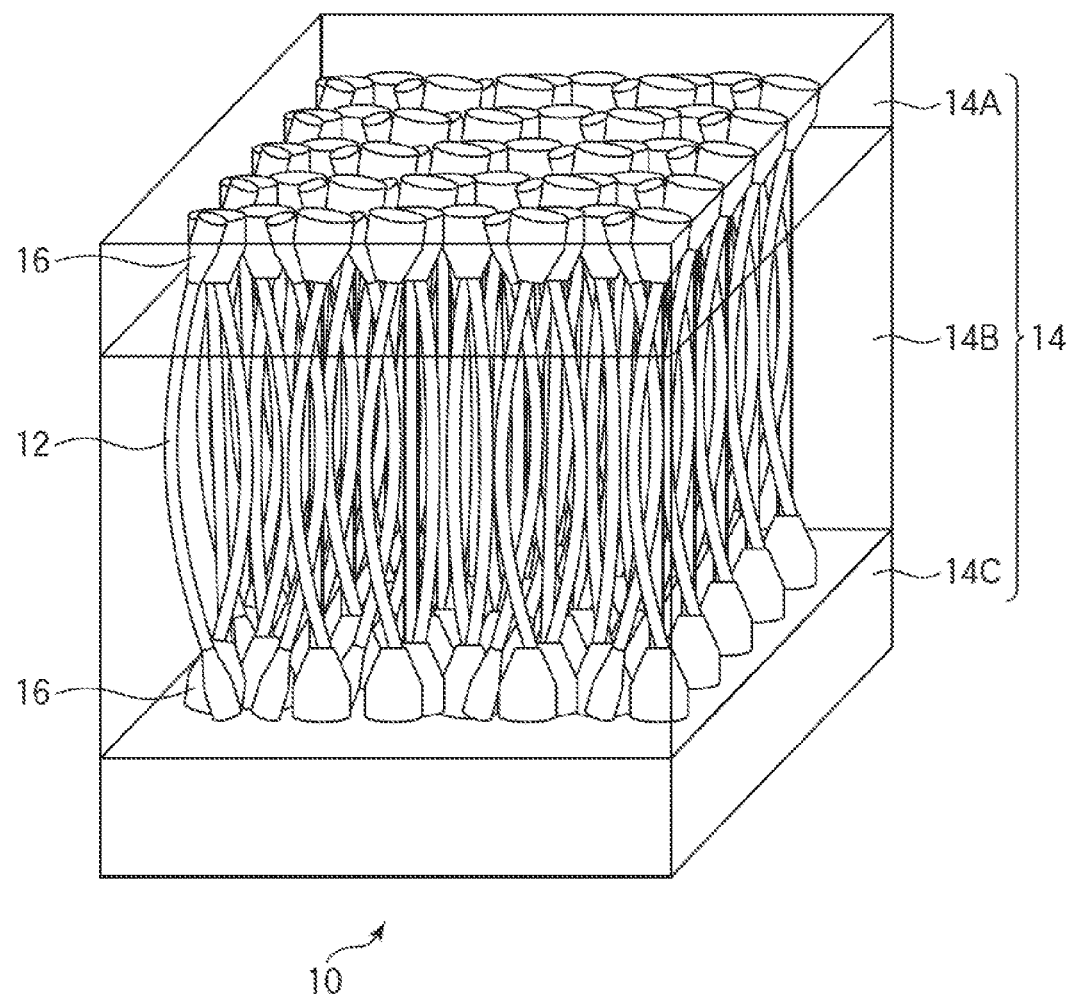

Thus, the carbon nanotube sheet 10 according to the present embodiment having the carbon nanotubes 12 with the coating films 16 formed on buried in the filling layer 14 of the layer body of the filling layers 14A, 14B, 14C is formed (FIG. 19).

As described above, according to the present embodiment, the thermoplastic resin layer is provided on the surface of the filling layer supporting the carbon nanotubes, whereby the carbon nanotube sheet of small thermal contact resistance to a mounted body can be manufactured.

[A Fifth Embodiment]

The electronic device and the method of manufacturing the electronic device according to a fifth embodiment will be explained with reference to FIGS. 20 to 22B. The same members of the present embodiment as those of the carbon nanotube sheet and the method of manufacturing the carbon nanotube sheet according to the first to the fourth embodiments illustrated in FIGS. 1A to 19 are represented by the same reference numbers not to repeat or to simplify their explanation.

Figure 20:
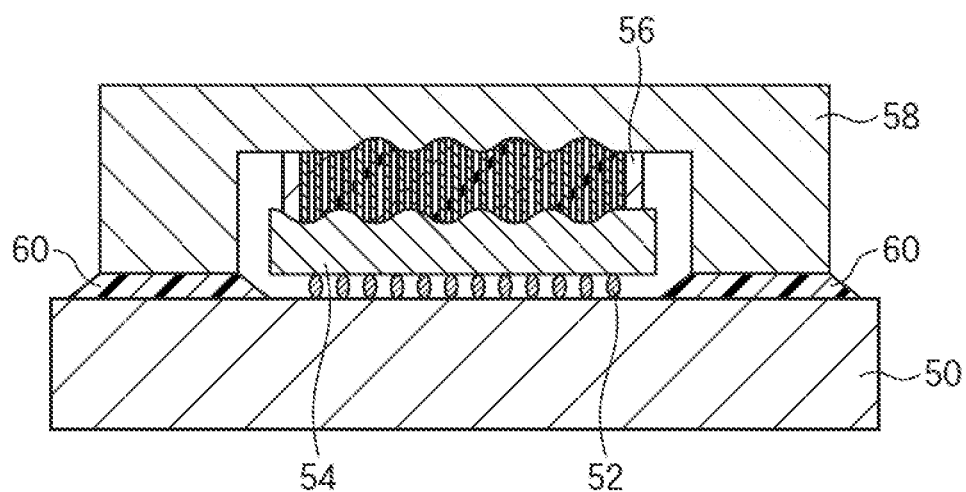
FIG. 20 is a diagrammatic sectional view illustrating a structure of an electronic device according to a fifth embodiment.

FIG. 20 is a diagrammatic sectional view illustrating the structure of the electronic device according to the present embodiment. FIGS. 21A-21D are sectional views illustrating the method of manufacturing the electronic device according to the present embodiment. FIGS. 22A and 22B are diagrammatic sectional views illustrating the structures of the electronic parts according to the fifth embodiment.

In the present embodiment, an electronic device using the carbon nanotube sheet according to the first to the fourth embodiments as the heat conductive sheet, and the method of manufacturing the electronic device will be explained.

First, the structure of the electronic device according to the present embodiment will be explained with reference to FIG. 20.

Over a circuit substrate 50, such as a multi-level interconnection substrate, etc., semiconductor element 54, e.g., CPU, etc. is mounted. The semiconductor element 54 is electrically connected to the circuit substrate 50 via projected electrodes 52, such as solder bumps, etc.

Over the semiconductor element 54, a heat spreader 58 for dispersing the heat from the semiconductor element 54 is formed, covering the semiconductor element 54. Between the semiconductor element 54 and the heat spreader 58, the carbon nanotube sheet 56 according to any one of the first to the fourth embodiments is formed. The heat spreader 58 is adhered to the circuit substrate 50 with, e.g., an organic sealant 60.

Thus, in the electronic device according to the present embodiment, the carbon nanotube sheet according to the first to the fourth embodiments is provided between the semiconductor element 54 and the heat spreader 58, i.e., the heat generator and the heat radiator.

As described above, the carbon nanotube sheet according to the first to the fourth embodiments has the carbon nanotubes 12 oriented in the direction of thickness of the sheet, and the thermal conductivity vertical to the plane is very high. The carbon nanotube sheet according to the second to the fourth embodiment has the coating film 16 on one ends or both ends of the carbon nanotubes 12, whereby the thermal contact resistance can be drastically decreased.

Thus, the described carbon nanotube sheet is used as the heat conductive sheet formed between the semiconductor element 54 and the heat spreader 58, whereby the heat generated from the semiconductor element 54 can be effectively vertically conducted to the heat spreader 58, and the heat radiation efficiency can be increased. Thus, the reliability of the electronic device can be improved.

The carbon nanotube sheet 56 has at least the surface of the filling layer supporting the carbon nanotubes 12 formed a thermoplastic resin material. Thus, the adhesion of the carbon nanotube sheet 56 to the semiconductor element 54 and the heat spreader 58 can be improved, and the thermal conductivity of the carbon nanotube sheet 56 can be improved.

Next, the method of manufacturing the electronic device according to the present embodiment will be explained with reference to FIGS. 21A-21D.

Figure 21A:
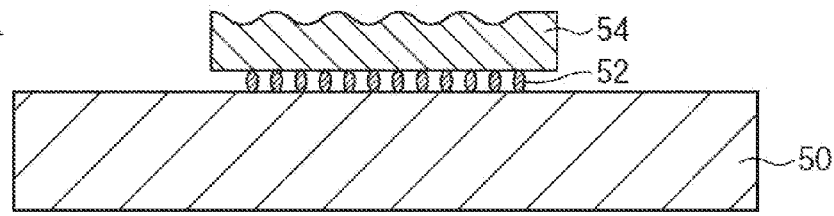
FIGS. 21A-21D are sectional views illustrating a method of manufacturing the electronic device according to the fifth embodiment.
Figure 22A:
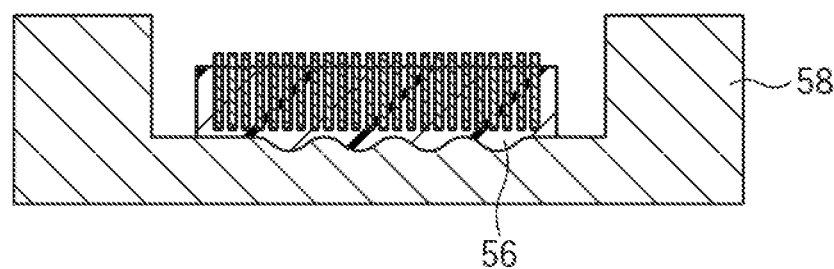
FIGS. 22A and 22B are diagrammatic sectional views illustrating structures of an electronic parts according to the fifth embodiment.
Figure 22B:
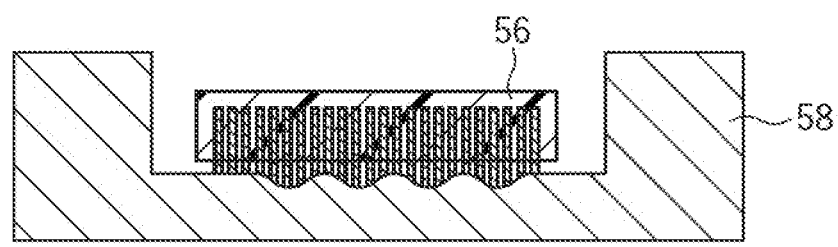

Over the circuit substrate 50, the semiconductor element 54 is mounted via the projected electrodes 52 (FIG. 21A). In the drawings of the present embodiment, to make the effect of the electronic device according to the present embodiment understandable, the concavities and convexities of the surfaces of the semiconductor element 54 and the heat spreader 58 opposed to each other are emphasized.

Figure 21B:
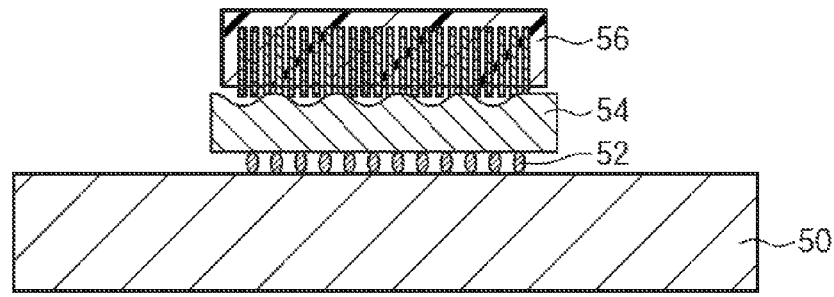

Then, over the semiconductor element 54 mounted over the circuit substrate 56, the carbon nanotube sheet 56 described in any one of the first to the fourth embodiments is mounted (FIG. 21B). In the drawing of the present embodiment, the carbon nanotube sheet according to the first embodiment is used, but the carbon nanotube sheet according to the second to the fourth embodiments may be used.

Figure 21C:
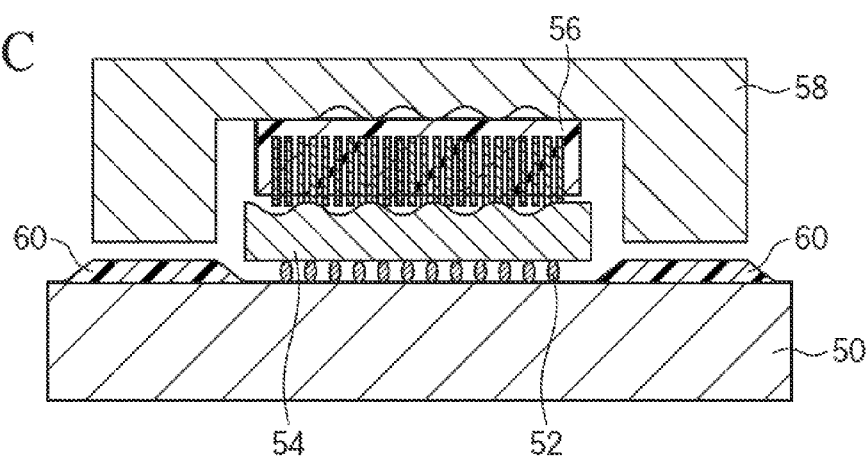
Figure 21D:
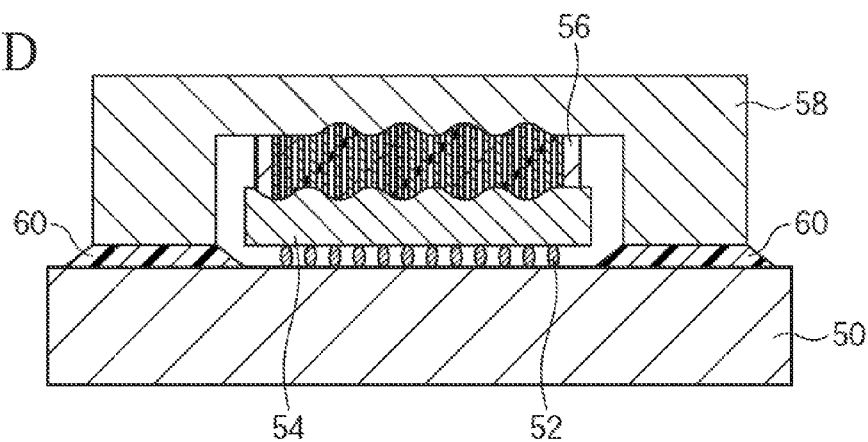

Next, to the circuit substrate 50, the organic sealant 60 for securing the heat spreader 58 is applied, and the heat spreader 58 is mounted on the semiconductor element 54 with the carbon nanotube sheet 56 mounted on (FIG. 21C).

Then, with the heat spreader 58 set under load, heat processing is made to reflow the carbon nanotube sheet 56. For the carbon nanotube sheet 56 having the filling layer 14 of, e.g., "Micromelt 6239" from Henkel Japan Ltd., the heat processing is made, e.g., at 195° C. and for 10 minutes under a 0.25 MPa load.

This heat processing melts and liquefies the thermoplastic resin forming the carbon nanotubes sheet 56 to deform the carbon nanotube sheet 56 along the concavities and convexities in the surfaces of the semiconductor element and the heat spreader 58. The carbon nanotubes 12 in the carbon nanotube sheet 54 is less restricted by the filling layer 14, and the ends of the carbon nanotubes 12 come into direct contact with the semiconductor element 54 and the heat spreader 58. At this time, the carbon nanotubes 12, the material of which is flexible and soft, can flex in accordance with the concavities and convexities of the semiconductor element 54 and the heat spreader 58. Thus, more of the carbon nanotubes 12 are in direct contact with the semiconductor element 54 and the heat spreader 58, whereby the thermal contact resistance between the carbon nanotube sheet 56, and the semiconductor element 54 and the heat spreader 58 can be drastically decreased.

The load at this time may be in the load range which the carbon nanotube sheet 56 is deformed along the concavities and convexities present in the surfaces of the semiconductor element 54 and the heat spreader 58 to be into sufficient contact therewith. The temperature and the period of time of the heat processing may be selected in the range which the thermoplastic resin present in the interface between the semiconductor element 54 and the heat spreader 58 is melted and flows to form the surface state that the ends of the carbon nanotubes are in direct contact with the semiconductor element 54 and the heat spreader 58.

Next, the electronic device is cooled to room temperature to set the thermoplastic resin of the filling layer 14 while securing the heat spreader 58 to the circuit substrate 50 with the organic sealant 60. At this time, the thermoplastic resin exhibit adhesiveness and can securely adhere the semiconductor element 54 and the heat spreader 58 to each other by the carbon nanotube sheet 56. Thus, even after the electronic device has been cooled to room temperature, the low thermal contact resistance between the carbon nanotube sheet 56, and the semiconductor element 54 and the heat spreader 58 can be retained.

The carbon nanotube sheet having the filling layer 14 formed of a material other than a thermoplastic resin cannot exhibit adhesiveness to the once set filling layer 14, and the carbon nanotube sheet, and the semiconductor element 54 and the heat spreader are adhered only by press contact. Even when the semiconductor element 54 and the heat spreader 58 are press-contacted, the ends of the carbon nanotubes 12 cannot directly contact with the semiconductor element 54 and the heat spreader 58. It will be an idea of exposing the ends of the carbon nanotubes 12 in advance, but it is difficult to etch the filling layer 14 alone with the selectivity between the carbon nanotubes 12 and the filling layer 14 being sufficiently ensured. Thus, the thermal contact resistance between the semiconductor element 54 and the heat spreader 58 cannot be sufficiently decreased.

In the above-described example, the carbon nanotube sheet 56 and the heat spreader 58 are prepared as independent electronic parts, but the carbon nanotube sheet 56 may be formed in advance in the inside surface of the heat spreader 58. In this case, as exemplified in FIG. 22A, the surface of the carbon nanotube sheet 56 with the filling layer 14 formed on can be adhered to the inside surface of the heat spreader 58. Otherwise, as exemplified in FIG. 22B, the surface of the carbon nanotube sheet 56 where the carbon nanotubes 12 are exposed can be adhered to the inside surface of the heat spreader 58.

The electronic parts exemplified in FIG. 22A can be manufactured by manufacturing the carbon nanotube sheet 56 the heat spreader 58 independently, then mounting the carbon nanotube sheet 56 on the inside surface of the heat spreader 58, making heat processing with a load being applied as required to adhere the carbon nanotube sheet 56. The electronic parts of FIG. 22A is applicable, as the carbon nanotube sheet 56, to not only the carbon nanotube sheet according to the first or the second embodiment but also to the carbon nanotube sheet according to the third and the fourth embodiments.

The electronic parts of FIG. 22B can be manufactured in the same way as in, e.g., the method of manufacturing the carbon nanotube sheet according to the first or the second embodiment by using the heat spreader 58 as the substrate 30.

As described above, according to the present embodiment, the carbon nanotube sheet according to the first to the fourth embodiment is disposed between the semiconductor element and the heat spreader, whereby the thermal conductivity between them can be drastically improved. Thus, the heat radiation efficiency of the heat generated by the semiconductor element can be improved, and the reliability of the electronic device can be improved.

[A Sixth Embodiment]

The electronic device and the method of manufacturing the electronic device according to a sixth embodiment will be explained with reference to FIGS. 23 to 24B. The carbon nanotube sheet and the method of manufacturing the carbon nanotube sheet according to the first to the fourth embodiment illustrated in FIGS. 1 to 19 and the electronic device and the method of manufacturing the electronic device according to the fifth embodiment illustrated in FIGS. 20 to 22B are represented by the same reference numbers not to repeat or to simplify their explanation.

Figure 23:
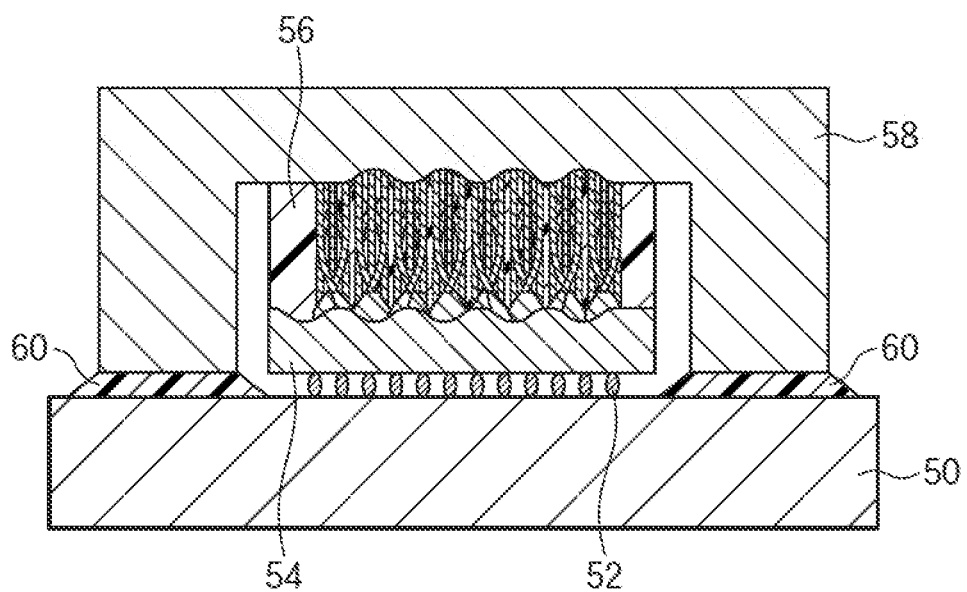
FIG. 23 is a diagrammatic sectional view illustrating a structure of an electronic device according to a sixth embodiment.
Figure 24A:
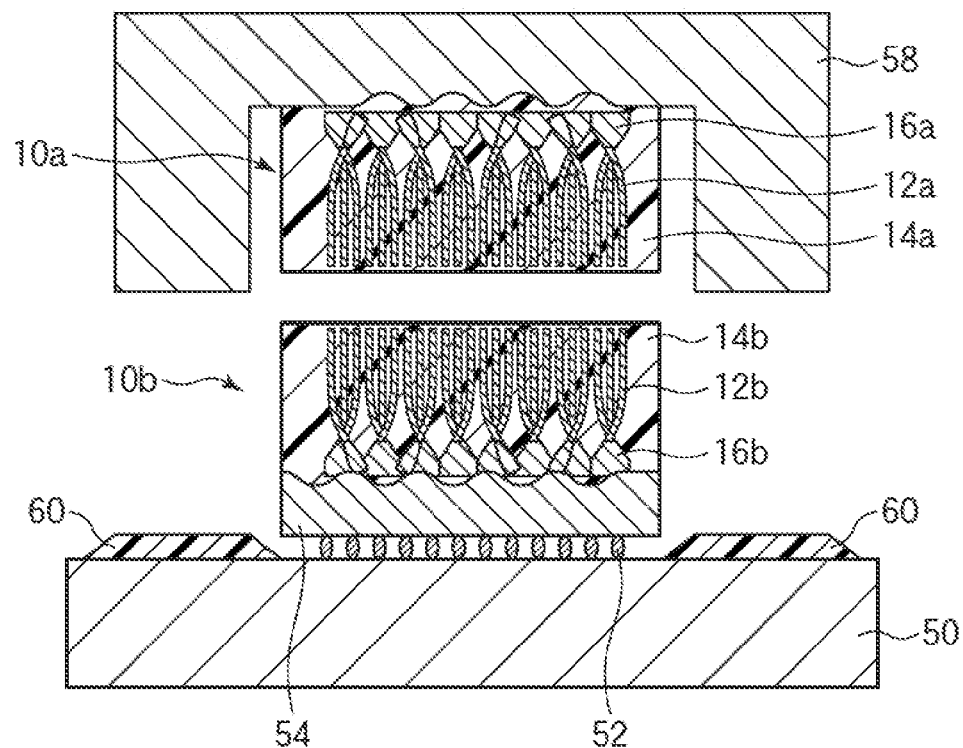
FIGS. 24A-24B are sectional views illustrating a method of manufacturing the electronic device according to the sixth embodiment.
Figure 24B:
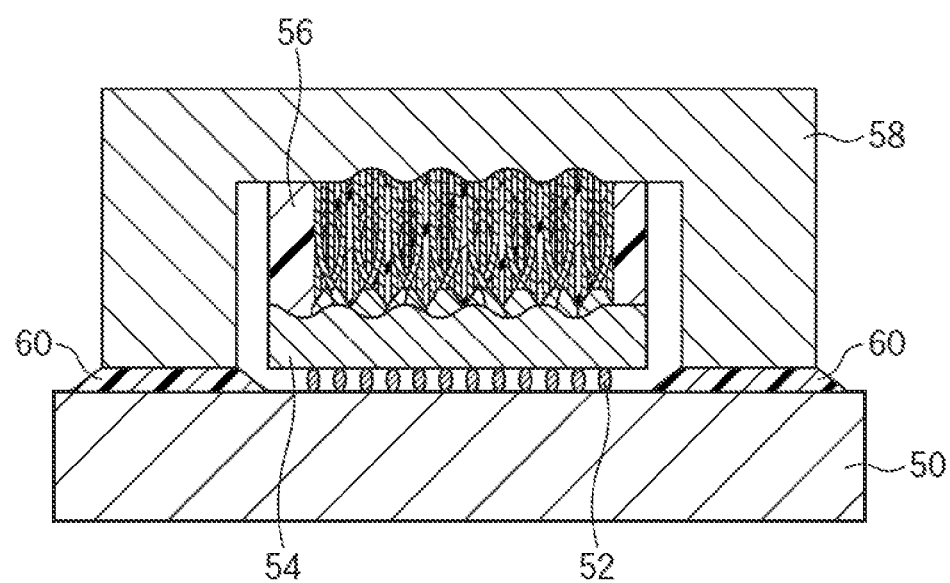

FIG. 23 is a diagrammatic sectional view illustrating the structure of the electronic device according to the present embodiment. FIGS. 24A-24B are sectional views illustrating the method of manufacturing the electronic device according to the present embodiment.

First, the structure of the electronic device according to the present embodiment will be explained with reference to FIG. 23.

As illustrated in FIG. 23, the electronic device according to the present embodiment corresponds to the electronic device according to the fifth embodiment having the carbon nanotube sheet 56 according to the third embodiment disposed between the semiconductor element 54 and the heat spreader 58.

Next, the method of manufacturing the electronic device according to the present embodiment will be explained with reference to FIGS. 24A and 24B.

First, in the same way as in, e.g., the method of manufacturing the carbon nanotube sheet according to the third embodiment illustrated in FIGS. 10A to 11B, the carbon nanotube sheet 10a having the carbon nanotubes 12a with the coating film 16a formed on buried in the filling layer 14a, and the carbon nanotube sheet 10b having the carbon nanotubes 12b with the coating film 16b formed on buried in the filling layer 14b are prepared.

Next, in the same way as in, e.g., the method of manufacturing the electronic device according to the fifth embodiment illustrated in FIG. 21A, the semiconductor element 54 is mounted on the circuit substrate 50 with the projected electrodes 52.

Next, the carbon nanotube sheet 10b is adhered to the upper surface of the semiconductor element 54. The carbon nanotube sheet 10a is adhered to the inside surface of the heat spreader 58. The carbon nanotube sheets 10a, 10b can be adhered to the semiconductor element 54 and the heat spreader 58 by mounting the carbon nanotube sheets 10a, 10b on the semiconductor element 54 and the heat spreader 58, and then heat processing under load as required.

Next, the organic sealant 60 for securing the heat spreader 58 is applied to the circuit substrate 30, and then the heat spreader 58 with the carbon nanotube sheet 10a adhered is mounted over the semiconductor element 54 with the carbon nanotube sheet 10b adhered to (FIG. 24A).

Then, in the same way as in, e.g., the method of manufacturing the carbon nanotube sheet according to the third embodiment illustrated in FIGS. 12 and 13, heat processing is made with the heat spreader 58 under load. Thus, the filling layers 14a, 14b are melted and liquefied, and are unified, and the carbon nanotubes 12a and the carbon nanotubes 12b are mutually inserted in the gaps between the carbon nanotubes 12b and in the gaps between the carbon nanotubes 12a. Thus, the carbon nanotube sheet 56 according to the third embodiment is formed between the semiconductor element 54 and the heat spreader 58.

The carbon nanotube sheet 56 is formed, and simultaneously therewith the carbon nanotube sheet 56 is deformed in accordance with the concavities and convexities in the surface of the semiconductor element 54 and the heat spreader 58. Also, the carbon nanotubes 12a, 12b in the carbon nanotube sheet 54 are less restricted by the filling layer 14 and have the ends in direct contact with the semiconductor element 54 and the heat spreader 58 (this is the same with the case where the coating films 16a, 16b are formed). Thus, the thermal contact resistance between the carbon nanotube sheet 56, and the semiconductor element 54 and the heat spreader 58 can be drastically decreased.

The load at this time may be in a load range that the carbon nanotube sheets 10a, 10b are unified, and the carbon nanotube sheet 56 is deformed along the concavities and convexities present in the surface of the semiconductor element and the heat spreader 58 to be brought into sufficient contact. The temperature and the period of time of the heat processing may be selected in the range that the thermoplastic resin present in the interface between the semiconductor element 54 and the heat spreader 58 is melted an flow to bring the ends of the carbon nanotubes 12 into direct contact with the semiconductor element 54 and the heat spreader 58.

Then, the electronic device is cooled to room temperature to set the thermoplastic resin of the filling layer 14 and secure the heat spreader 58 to the circuit substrate 50 by the organic sealant 60. At this time, the thermoplastic resin exhibits adhesiveness to thereby securely adhere the semiconductor element 54 and the heat spreader 58 to each other by the carbon nanotube sheet 56. Thus, even after cooled to room temperature, low thermal contact resistance between the carbon nanotube sheet 56, and the semiconductor element 54 and the heat spreader 58 can be retained.

As described above, according to the present embodiment, the carbon nanotube sheet according to the third embodiment is disposed between the semiconductor element and the heat spreader, whereby the thermal conductivity between them can be drastically improved. Thus, the heat radiation efficiency of the heat generated by the semiconductor element can be increased, and the reliability of the electronic device can be improved.

[A Seventh Embodiment]

The electronic device according to a seventh embodiment will be explained with reference to FIG. 25.

Figure 25:
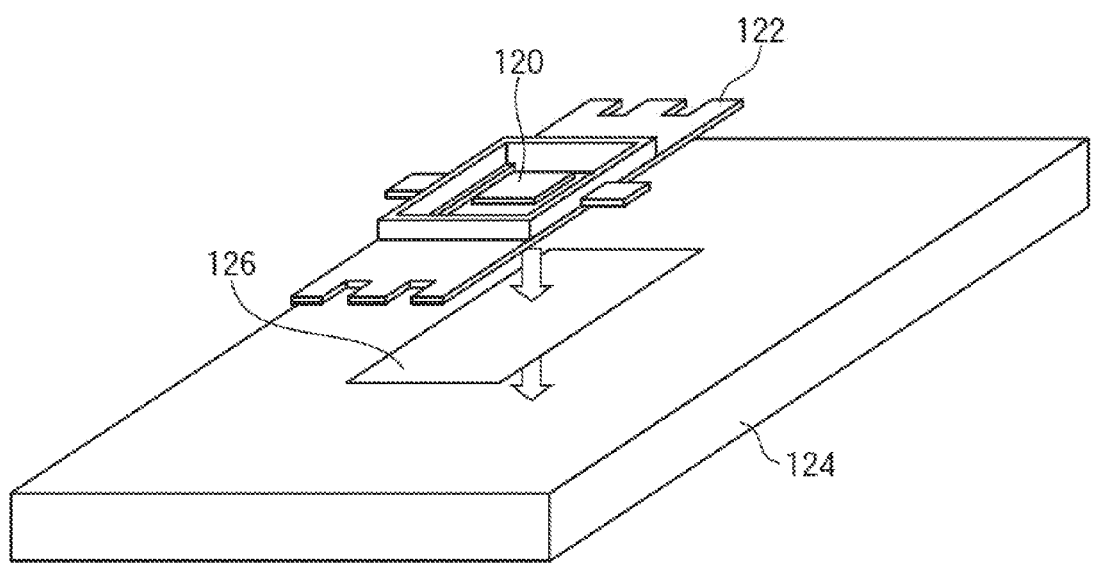
FIG. 25 is a perspective view illustrating a structure of an electronic device according to a seventh embodiment.

FIG. 25 is a perspective view illustrating the structure of the electronic device according to the present embodiment.

In the present embodiment, the electronic device using the carbon nanotube sheet according to the first to the fourth embodiment as the heat conductive sheet which functions also as the electrically conductive sheet will be explained.

As illustrated in FIG. 25, the HPA (High Power Amplifier) 70 used in, e.g., the radio communication stations is built in a package 72 and is jointed to the heat sink 74 at back surface of the package 72. The heat generated by the HPA 70 is radiated to the heat sink 74 through the back surface of the package 72. The package 72 also used as the electric ground (ground surface) and must be electrically connected to the heat sink 74. To this end, an electrically and thermally good conductor is preferably used for the joint between the package 72 and the heat sink 74.

As described in the first to the fourth embodiments, the carbon nanotube sheet according to the first to the fourth embodiments permits the carbon nanotubes 12 or the carbon nanotubes 12 with the coating film 16 formed on to be directly contacted to a heat generator or a heat radiator. That is, the carbon nanotube sheet according to the first to the fourth embodiment can be used not only as a heat radiation sheet, but also as an electrically conductive sheet.

Thus, as illustrated in FIG. 25, the carbon nanotube sheet 76 according to any one of the first to the fourth embodiments is used at the joint between the package 72 and the heat sink 74, whereby the package 72 and the heat sink 74 can be electrically connected to each other. The heat generated by the HPS 70 can be efficiently conducted to the heat sink 74, whereby the heat radiation efficiency can be increased. Thus, the reliability of the electronic device can be improved.

The electronic device according to the present embodiment can be manufactured in the same way as in, e.g., the method of manufacturing the electronic device according to the fifth or the sixth embodiment.

As described above, according to the present embodiment, the carbon nanotube sheet according to the first to the fourth embodiments is disposed between the package of the HPA and heat sink, whereby the thermal conductivity between them can be drastically improved. Thus, the heat radiation efficiency of the heat generated by the HPA can be increased. Thus, the reliability of the electronic device can be increased. The HPA and the heat sink as the ground can be electrically connected to each other.

[Modified Embodiments]

The above-described embodiments can cover other various modifications.

For example, in the above-described embodiments, the sheet structure using the linear structure of carbon atoms is exemplified by carbon nanotube sheet using carbon nanotubes, but the sheet structure using the linear structure of carbon atoms is not limited to this. As the linear structure of carbon atoms, other than carbon nanotubes, carbon nanowires, carbon rods and carbon fibers are listed. These linear structures are the same as the carbon nanotubes except that they are different from the carbon nanotubes in size. The embodiments are applicable to the sheet structures using these linear structures.

The constituent materials and the manufacturing conditions described in the embodiments described above are not essential and can be changed suitably in accordance with purposes, etc.

The uses of the carbon nanotube sheet are not limited to those described in the embodiments described above. The described carbon nanotube sheet is applicable, as the heat conductive sheet, to, e.g., the heat radiation sheet of CPUs, high power amplifiers of radio communication stations, high power amplifiers for radio communication terminals, high power switches for electric motors, servers, personal computers, etc. By utilizing the high allowable current density of the carbon nanotubes, the carbon nanotube sheet can be applicable to vertical interconnection sheets and various applications using the vertical interconnection sheets.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic device comprising:
   a heat generator;
   a heat radiator; and
   a heat radiation material disposed between the heat generator and the heat radiator and comprising: a plurality of cylindrical structures made up of carbon atoms; a filling layer formed of a thermoplastic resin and disposed between the plurality of cylindrical structures; and a first coating film having a thickness of 25 nm to 1000 nm, formed so as to coat individual ends of the plurality of cylindrical structures and formed of a material having a higher thermal conductivity than the thermoplastic resin.

2. The electronic device according to claim 1, wherein the thermoplastic resin changes a state between liquid and solid in accordance with temperatures.

3. The electronic device according to claim 2, wherein the thermoplastic resin exhibits adhesiveness when it changes the state from liquid to solid.

4. The electronic device according to claim 1, wherein the filling layer includes a first layer formed of the thermoplastic resin, a second layer disposed on the first layer and formed of a material different from the thermoplastic resin, and a third layer disposed on the second layer and formed of the thermoplastic layer.

5. The electronic device according to claim 1, wherein the plurality of cylindrical structures are oriented in a direction of a film thickness of the filling layer.

6. The electronic device according to claim 1, wherein at least one end of the plurality of cylindrical structures are exposed from the filling layer.

7. The electronic device according to claim 1, further comprising: a second coating film having a thickness of 25 nm to 1000 nm, formed so as to coat individual other ends of the plurality of cylindrical structures and formed of a material having a higher thermal conductivity than the thermoplastic resin.

* * * * *